(12) United States Patent
Kim

(10) Patent No.: US 11,367,503 B2
(45) Date of Patent: Jun. 21, 2022

(54) SEMICONDUCTOR MEMORY DEVICE, CONTROLLER, MEMORY SYSTEM AND METHOD OF OPERATING THE SAME

(71) Applicant: SK hynix Inc., Gyeonggi-do (KR)

(72) Inventor: Jin Sub Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 30 days.

(21) Appl. No.: 17/009,091

(22) Filed: Sep. 1, 2020

(65) Prior Publication Data
US 2021/0304837 A1 Sep. 30, 2021

(30) Foreign Application Priority Data

Mar. 31, 2020 (KR) ........................ 10-2020-0038751

(51) Int. Cl.
*G11C 29/44* (2006.01)
*G11C 29/12* (2006.01)
*G11C 29/10* (2006.01)
*G11C 29/42* (2006.01)

(52) U.S. Cl.
CPC .............. *G11C 29/44* (2013.01); *G11C 29/10* (2013.01); *G11C 29/12005* (2013.01); *G11C 29/42* (2013.01)

(58) Field of Classification Search
CPC ... G11C 29/44; G11C 29/10; G11C 29/12005; G11C 29/42
See application file for complete search history.

(56) References Cited

U.S. PATENT DOCUMENTS

| | | | |
|---|---|---|---|
| 10,175,892 B1* | 1/2019 | Kim | G06F 12/0246 |
| 2018/0342305 A1* | 11/2018 | Cha | G11C 11/5642 |
| 2021/0166774 A1* | 6/2021 | Cha | G11C 16/3495 |
| 2022/0011973 A1* | 1/2022 | Kim | G06F 3/0604 |

FOREIGN PATENT DOCUMENTS

| | | |
|---|---|---|
| KR | 10-2015-0029404 | 3/2015 |
| KR | 10-2019-0022987 | 3/2019 |

* cited by examiner

*Primary Examiner* — Tuan T Nguyen
(74) *Attorney, Agent, or Firm* — IP & T Group LLP

(57) ABSTRACT

The present technology includes a method of operating a controller that controls a semiconductor memory device including a plurality of memory blocks. The method includes receiving a read request for data included in any one memory block among the plurality of memory blocks from a host, and controlling the semiconductor memory device to read data corresponding to the read request using a read-history table. The read-history table includes read voltages used for a plurality of read pass operations for the any one memory block, respectively.

8 Claims, 23 Drawing Sheets

FIG. 19A

| Block | R1_t1 | R1_t2 | R1_t3 |
|---|---|---|---|
| BLK1 | VR1_a1 | VR1_b1 | VR1_c1 |
| BLK2 | VR1_a2 | VR1_b2 | VR1_c2 |
| ... | ... | ... | ... |
| BLKz | VR1_az | VR1_bz | VR1_cz |

FIG. 19B

| Block | Page | R1_t1 | R1_t2 | R1_t3 |
|---|---|---|---|---|
| BLK1 | P1 | VR1_a11 | VR1_b11 | VR1_c11 |
| BLK1 | P2 | VR1_a21 | VR1_b21 | VR1_c21 |
| BLK1 | ... | ... | ... | ... |
| BLK1 | Pn | VR1_an1 | VR1_bn1 | VR1_cn1 |
| BLK2 | P1 | VR1_a12 | VR1_b12 | VR1_c12 |
| BLK2 | P2 | VR1_a22 | VR1_b22 | VR1_c22 |
| BLK2 | ... | ... | ... | ... |
| BLK2 | Pn | VR1_an2 | VR1_bn2 | VR1_cn2 |
| ... | ... | ... | ... | ... |
| BLKz | P1 | VR1_a1z | VR1_b1z | VR1_c1z |
| BLKz | P2 | VR1_a2z | VR1_b2z | VR1_c2z |
| BLKz | ... | ... | ... | ... |
| BLKz | Pn | VR1_anz | VR1_bnz | VR1_cnz |

FIG. 19C

| Block | Page Group | R1_t1 | R1_t2 | R1_t3 |
|---|---|---|---|---|
| BLK1 | GR1 | VR1_a11 | VR1_b11 | VR1_c11 |
| | GR2 | VR1_a21 | VR1_b21 | VR1_c21 |
| | ... | ... | ... | ... |
| | GRk | VR1_ak1 | VR1_bk1 | VR1_ck1 |
| BLK2 | GR1 | VR1_a12 | VR1_b12 | VR1_c12 |
| | GR2 | VR1_a22 | VR1_b22 | VR1_c22 |
| | ... | ... | ... | ... |
| | GRk | VR1_ak2 | VR1_bk2 | VR1_ck2 |
| ... | ... | ... | ... | ... |
| BLKz | GR1 | VR1_a1z | VR1_b1z | VR1_c1z |
| | GR2 | VR1_a2z | VR1_b2z | VR1_c2z |
| | ... | ... | ... | ... |
| | GRk | VR1_akz | VR1_bkz | VR1_ckz |

| Block | R1_t1 | R1_t2 | R2_t1 | R2_t2 | R3_t1 | R3_t2 |
|---|---|---|---|---|---|---|
| BLK1 | VR1_a1 | VR1_b1 | VR2_a1 | VR2_b1 | VR3_a1 | VR3_b1 |
| BLK2 | VR1_a2 | VR1_b2 | VR2_a2 | VR2_b2 | VR3_a2 | VR3_b2 |
| ... | ... | ... | ... | ... | ... | ... |
| BLKz | VR1_az | VR1_bz | VR2_az | VR2_bz | VR3_az | VR3_bz |

Depth of RHT=2 (spanning R1_t1, R1_t2)

RHT_MLC

SEMICONDUCTOR MEMORY DEVICE, CONTROLLER, MEMORY SYSTEM AND METHOD OF OPERATING THE SAME

CROSS-REFERENCE TO RELATED APPLICATION

The present application claims priority under 35 U.S.C. § 119(a) to Korean patent application number 10-2020-0038751, filed on Mar. 31, 2020, which is incorporated herein by reference in its entirety.

BACKGROUND

Field of Invention

The present disclosure relates to an electronic device, and more particularly, to a semiconductor memory device, a controller, and a method of operating a memory system including the semiconductor memory device and the controller.

Description of Related Art

A semiconductor memory device may be formed in a two-dimensional structure in which strings are horizontally arranged on a semiconductor substrate, or in a three-dimensional structure in which the strings are vertically stacked on the semiconductor substrate. A three-dimensional memory device was designed to overcome the limit of integration of a two-dimensional memory device, and thus may include a plurality of memory cells that are vertically stacked on a semiconductor substrate.

SUMMARY

An embodiment of the present disclosure provides a semiconductor memory device having improved read performance, a controller, and a method of operating a memory system including the semiconductor memory device and the controller.

A semiconductor memory device including a plurality of memory blocks may be controlled by a method of operating a controller according to an embodiment of the present disclosure. The method includes receiving a read request for data in a select memory block among the plurality of memory blocks from a host, and controlling the semiconductor memory device to read data corresponding to the read request using a read-history table. The read-history table includes read voltages used in previously successful read operations on the select memory block.

A semiconductor memory device including a plurality of memory blocks may be controlled by a method of operating a controller according to an embodiment of the present disclosure. The method includes receiving a read request for data included in a select memory block among the plurality of memory blocks from a host, controlling the semiconductor memory device to read data corresponding to the read request using a read-history table, and controlling the semiconductor memory device to perform a read operation using an additional read method, and updating the read-history table according to a result of the read operation using the additional read method, when error correction of read data using the read-history table is failed. The read-history table includes read voltages used in previously successful read pass operations on the select memory block.

In an embodiment, controlling the semiconductor memory device to perform the read operation using the additional read method and updating the read-history table may include controlling the read operation of the semiconductor memory device using a read retry table.

In an embodiment, controlling the semiconductor memory device to perform the read operation using the additional read method and updating the read-history table may include controlling the read operation of the semiconductor memory device using an optimum read voltage search method.

A controller according to an embodiment of the present disclosure controls a semiconductor memory device including a plurality of memory blocks. The controller includes a read-history table storage, a read voltage controller, and an error correction block. The read-history table storage stores a read-history table including first and second read voltages respectively used for first and second read pass operations on a select memory block among the plurality of memory blocks. The read voltage controller adjusts a read voltage used for a read operation of the semiconductor memory device based on the read-history table. The error correction block performs an error correction operation on first data received from the semiconductor memory device and which corresponds to a read request received from a host. When the error correction operation on the first data fails, the read voltage controller controls the semiconductor memory device to select the first read voltage, which is most recently updated among the first and second read voltages and to perform the read operation corresponding to the read request based on the first read voltage.

An operating method of a controller includes controlling a memory device to perform a first read operation of reading data multiple times with multiple most recently successful read voltages, respectively. The multiple most recently successful read voltages are maintained in a group. The operating method further includes controlling, when the first read operation fails, the memory device to perform a second read operation of reading the data with a read voltage different from each of the most recently successful read voltages, and updating, when the first or second read operation is successful, the group according to the successful read voltage of the first or second read operation.

The present technology may improve read performance of the semiconductor memory device, the controller, and the memory system including the semiconductor memory device and the controller.

BRIEF DESCRIPTION OF THE DRAWINGS

FIGS. 19A, 19B, and 19C are diagrams illustrating the RHT according to embodiments of the present disclosure.

DETAILED DESCRIPTION

Specific structural and functional description is provided only to describe the embodiments of the present disclosure. The present invention, however, may be carried out in various ways and be configured in various forms. Thus, the present invention is not limited to any of the disclosed embodiments nor to any specific details provided herein. Also, throughout the specification, reference to "an embodiment," "another embodiment" or the like is not necessarily to only one embodiment, and different references to any such phrase are not necessarily to the same embodiment(s). The term "embodiments" when used herein does not necessarily mean all embodiments.

Figure 1:
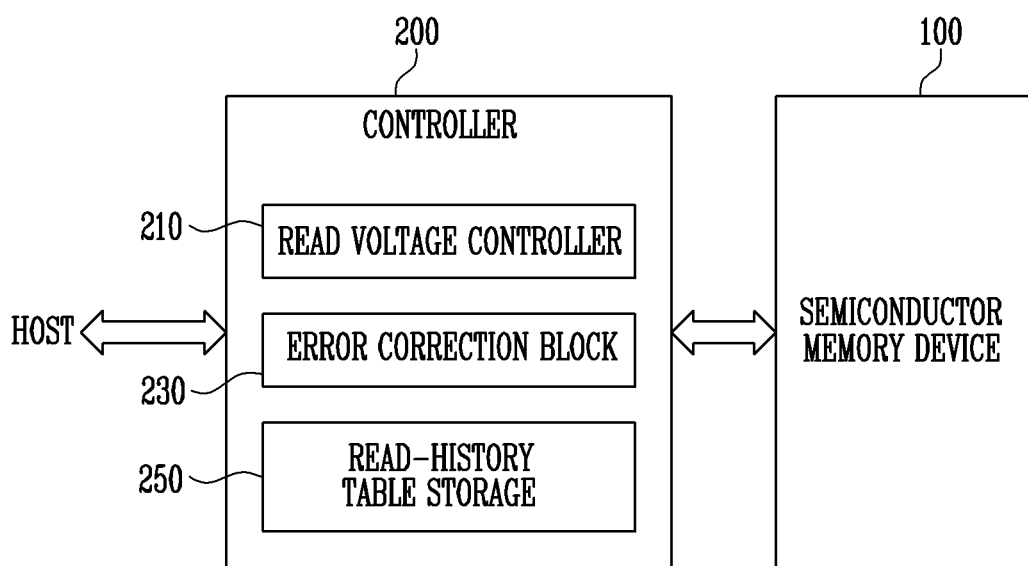
FIG. 1 is a block diagram illustrating a memory system including a controller according to an embodiment of the present disclosure.

FIG. 1 is a block diagram illustrating a memory system including a controller according to an embodiment of the present disclosure.

Referring to FIG. 1, the memory system 1000 includes a semiconductor memory device 100 and the controller 200. In addition, the memory system 1000 communicates with a host. Each of the semiconductor memory device 100 and the controller 200 may be provided as one chip, one package, and/or one device. Alternatively, the memory system 1000 may be provided as one storage device.

The controller 200 controls overall operation of the semiconductor memory device 100. In addition, the controller 200 controls an operation of the semiconductor memory device 100 based on a command received from the host.

The semiconductor memory device 100 operates in response to control of the controller 200. The semiconductor memory device 100 includes a memory cell array having a plurality of memory blocks. In an embodiment, the semiconductor memory device 100 may be a flash memory device.

The controller 200 may receive a write request, a read request, or the like from the host, and control the semiconductor memory device 100 based on the received requests. More specifically, the controller 200 may generate commands for controlling the operation of the semiconductor memory device 100 and transmit the commands to the semiconductor memory device 100.

The semiconductor memory device 100 is configured to receive a command and an address from the controller 200 and to access an area selected by the address of the memory cell array. That is, the semiconductor memory device 100 performs an internal operation corresponding to a command on the area selected by the address.

For example, the semiconductor memory device 100 may perform a program operation, a read operation, and an erase operation. During the program operation, the semiconductor memory device 100 may program data in the area selected by the address. During the read operation, the semiconductor memory device 100 may read data from the area selected by the address. During the erase operation, the semiconductor memory device 100 may erase data stored in the area selected by the address.

The controller 200 includes a read voltage controller 210, an error correction block 230, and a read-history table (RHT) storage 250.

The read voltage controller 210 may manage and adjust read voltages for reading data stored in the semiconductor memory device 100. For example, when the data read from the semiconductor memory device 100 is not corrected by the error correction block 230, the read voltage controller 210 may adjust at least one read voltage used for the read operation of the semiconductor memory device 100. According to the present disclosure, the read voltage controller 210 may adjust the read voltage used for the read operation of the semiconductor memory device 100 based on an RHT stored in the RHT storage 250.

The error correction block 230 is configured to detect and correct an error of data received from the semiconductor memory device 100 using an error correction code (ECC). The read voltage controller 210 may control the read voltage according to an error detection result of the error correction block 230 and control the semiconductor memory device 100 to perform re-reading. For example, the error correction block 230 may generate the ECC with respect to data to be stored in the semiconductor memory device 100. The generated ECC may be stored in the semiconductor memory device 100 together with the data. Thereafter, the error correction block 230 may detect and correct the error of the data read from the semiconductor memory device 100 based on the stored ECC. For example, the error correction block 230 has a set error correction capability. Data including error bits (or fail bits) exceeding the error correction capability of the error correction block 230 is referred to as 'uncorrectable ECC (UECC) data'. When the data read from the semiconductor memory device 100 is UECC data, the read voltage controller 210 may control the semiconductor memory device 100 to perform the read operation again by adjusting the read voltages.

The RHT storage 250 may store the RHT. The RHT may include read voltages used in a previous read operation. For example, the RHT may include information on read voltages that were successful in previous read operations (read-passed voltages). Such read-passed voltages may have been applied to normal data that does not include error(s), or to data with error(s) but within the correction capability of the error correction block 230.

The read voltage controller 210 may adjust the read voltage used in the semiconductor memory device 100 when the data read from the semiconductor memory device 100 is not corrected by the error correction block 230. For example, the read voltage controller 210 may adjust the read voltage based on the RHT stored in the RHT storage 250. That is, since a read level is adjusted based on the previously read-passed read voltage and the data is read using the adjusted read level, a probability that the error of the read data may be corrected by the error correction block 230 may increase.

According to the present disclosure, the RHT stored in the RHT storage 250 includes the read voltages used is previous successful read operations, each of which is sequentially added to the RHT. That is, the RHT according to the present disclosure includes a read voltage used in a most recent successful read operation a read voltage used in an immediately previous successful read operation. Accordingly, the RHT may store the read voltages used in at least two read-passed read operations in a sequence in which the read operations were performed. During the read operation, when UECC data is repeatedly received from the semiconductor memory device 100, that is, whenever the error correction block 230 repeatedly fails to correct error(s) in the read data received from the semiconductor memory device 100, the read voltage controller 210 adjusts the read voltage of the semiconductor memory device 100 with reference to the read voltages stored in the RHT in a time-based sequence. For example, when an error correction failure occurs with respect to the read data received from the semiconductor memory device 100, the read voltage controller 210 sets the read voltage used in the most recently read-passed read operation among the voltages of the RHT as the read voltage of the semiconductor memory device 100. The semiconductor memory device 100 performs the read operation again based on the set read voltage. Thereafter, if and when error correction failure occurs with respect to the read data received from the semiconductor memory device 100 using the most recently read-passed voltage, the read voltage controller 210 sets the read voltage used in the read-passed read operation therebefore, among the voltages of the RHT, as the read voltage of the semiconductor memory device 100.

That is, in accordance with the controller 200 according to an embodiment of the present disclosure, when error correction failure repeatedly occurs with respect to the same data, the read voltage of the semiconductor memory device 100 is adjusted by sequentially applying the read voltages used in previous read-passed read operations starting with the most recent read-passed voltage. Accordingly, one or more read voltages used in previously read-passed read operation(s) are applied and thus a probability of successfully reading the current data is improved. Thus, performance of the memory system 1000 is improved.

Figure 2:
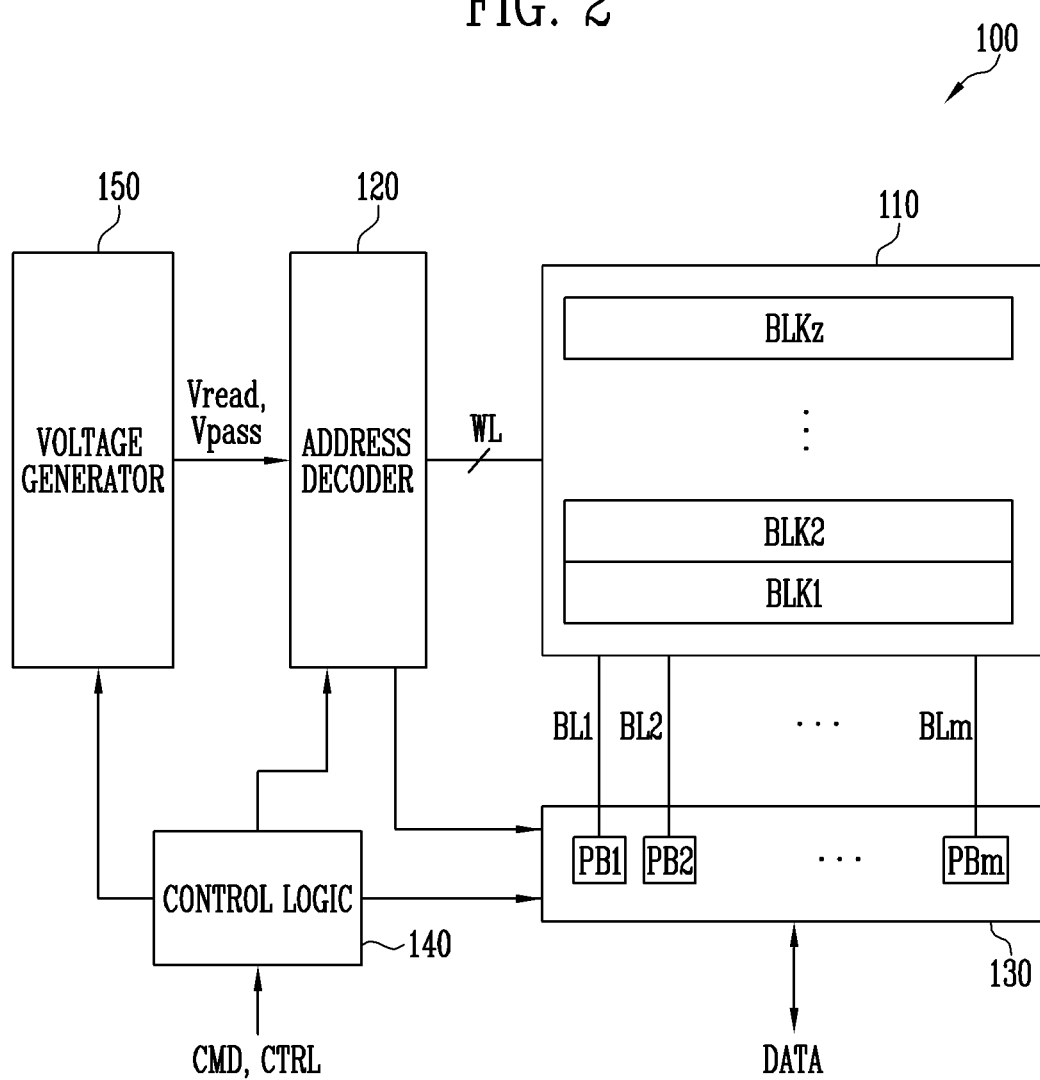
FIG. 2 is a block diagram illustrating a semiconductor memory device according to an embodiment of the present disclosure.

FIG. 2 is a block diagram illustrating the semiconductor memory device according to an embodiment of the present disclosure.

Referring to FIG. 2, the semiconductor memory device 100 includes a memory cell array 110, an address decoder 120, a read and write circuit 130, control logic 140, and a voltage generator 150.

The memory cell array 110 includes a plurality of memory blocks BLK1 to BLKz, which are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. In an embodiment, the plurality of memory cells are non-volatile memory cells, which may be configured with a vertical channel structure. The memory cell array 110 may be configured as a two-dimensional structure or a three-dimensional structure. Each of the plurality of memory cells in the memory cell array may store at least one bit of data. For example, each of the plurality of memory cells in the memory cell array 110 may be a single-level cell (SLC) storing one bit of data, a multi-level cell (MLC) storing two bits of data, a triple-level cell storing three bits of data, or a quad-level cell storing four bits of data. Still further, the memory cell array 110 may include a plurality of memory cells each storing five or more bits of data.

The address decoder 120, the read and write circuit 130, the control logic 140, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100. When power is supplied to the semiconductor memory device 100, information stored in a content-addressable memory (CAM) block may be read by the peripheral circuit, and the peripheral circuit may control the memory cell array to perform a data input/output operation of the memory cells under a condition set according to the read information.

The address decoder 120 is configured to decode a block address among received addresses. The address decoder 120 selects at least one memory block according to the decoded block address. In addition, the address decoder 120 applies a read voltage Vread generated in the voltage generator 150 to a selected word line of the selected memory block at a time of a read voltage application operation during a read operation, and applies a pass voltage Vpass to the remaining unselected word lines. In addition, during a program verify operation, the address decoder 120 applies a verify voltage generated in the voltage generator 150 to the selected word line of the selected memory block, and applies the pass voltage Vpass to the remaining unselected word lines.

The address decoder 120 is configured to decode a column address of the received addresses. The address decoder 120 transmits the decoded column address to the read and write circuit 130.

A read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130. In the present specification, memory cells connected to one word line may be referred to as a "physical page".

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm senses a change of an amount of a current flowing according to a programmed state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. In an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operation of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140.

The address decoder 120, the read and write circuit 130, and the voltage generator 150 may function to perform a read operation, a write operation, and an erase operation on the memory cell array 110. These components perform the read operation, the write operation, and the erase operation on the memory cell array 110 based on the control of the control logic 140.

Figure 3:
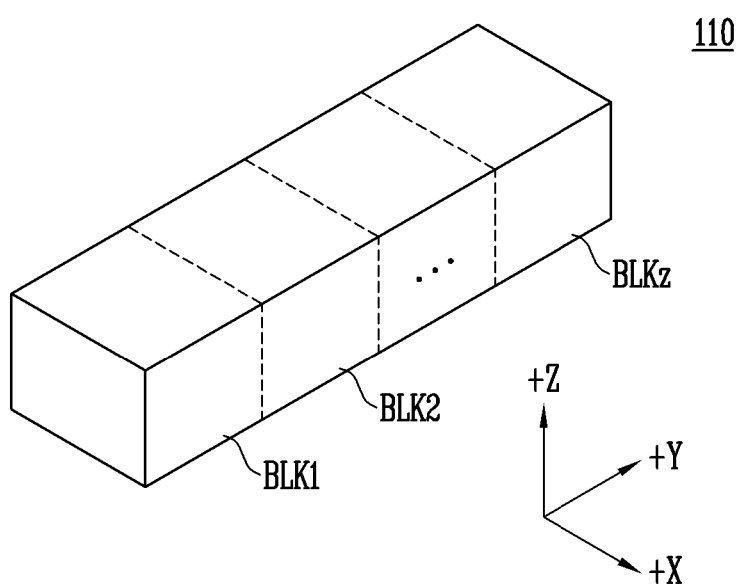
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5.

Figure 4:
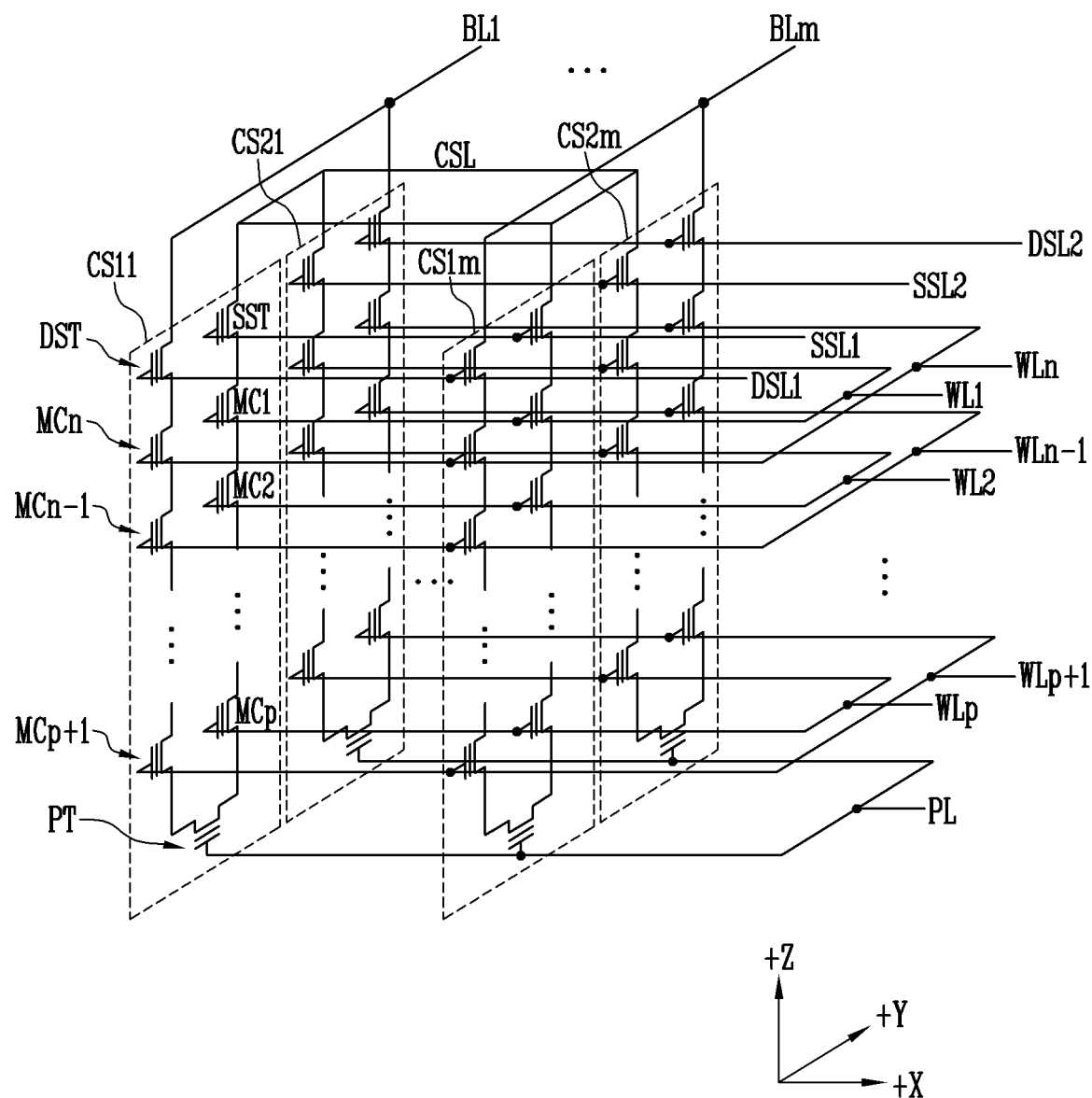
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 2.

Referring to FIG. 4, the memory block BLKa includes a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 4, two cell strings are arranged in a column direction (that is, the +Y direction). However, this is for clarity; three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

In an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

In another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a −Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

In another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the bit lines, and odd-numbered cell strings among the cell strings CS11 to CS1m or CS21 to CS2m arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control the dummy memory cell(s), each of dummy memory cell may have a required threshold voltage. Before or after an erase operation for the memory block BLKa, program operations for all or some of the dummy memory cells may be performed. When the erase operation is performed after the program operation is performed, the dummy memory cells may have the required threshold voltage by controlling a voltage applied to dummy word lines connected to the respective dummy memory cells.

Figure 5:
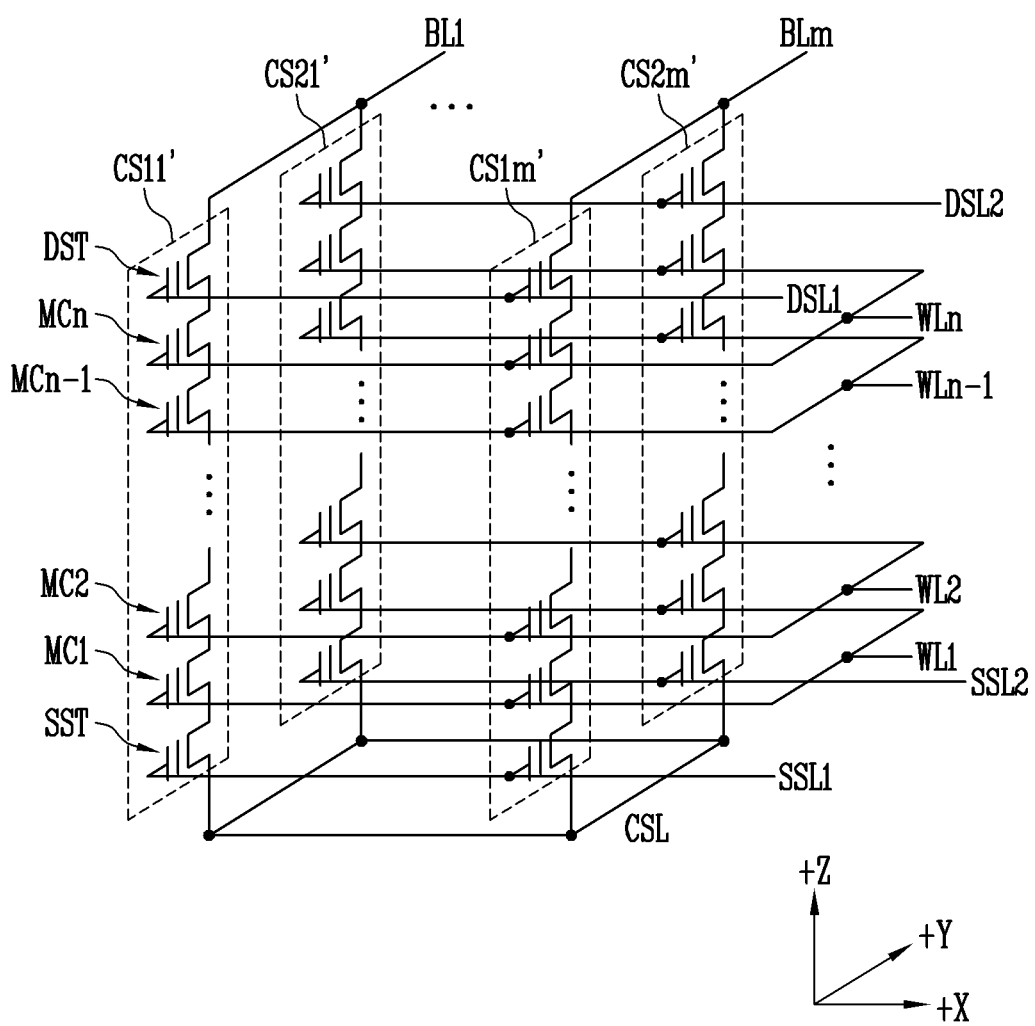
FIG. 5 is a circuit diagram illustrating another embodiment of any one memory block BLKb of the memory blocks BLK1 to BLKz of FIG. 3.

FIG. 5 is a circuit diagram illustrating another embodiment of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. In another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to the memory block BLKa of FIG. 4 except that the pipe transistor PT is excluded from each cell string.

In another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control the dummy memory cell(s), each dummy memory cell may have a required threshold voltage. Before or after an erase operation for the memory block BLKb, program operations for all or some of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
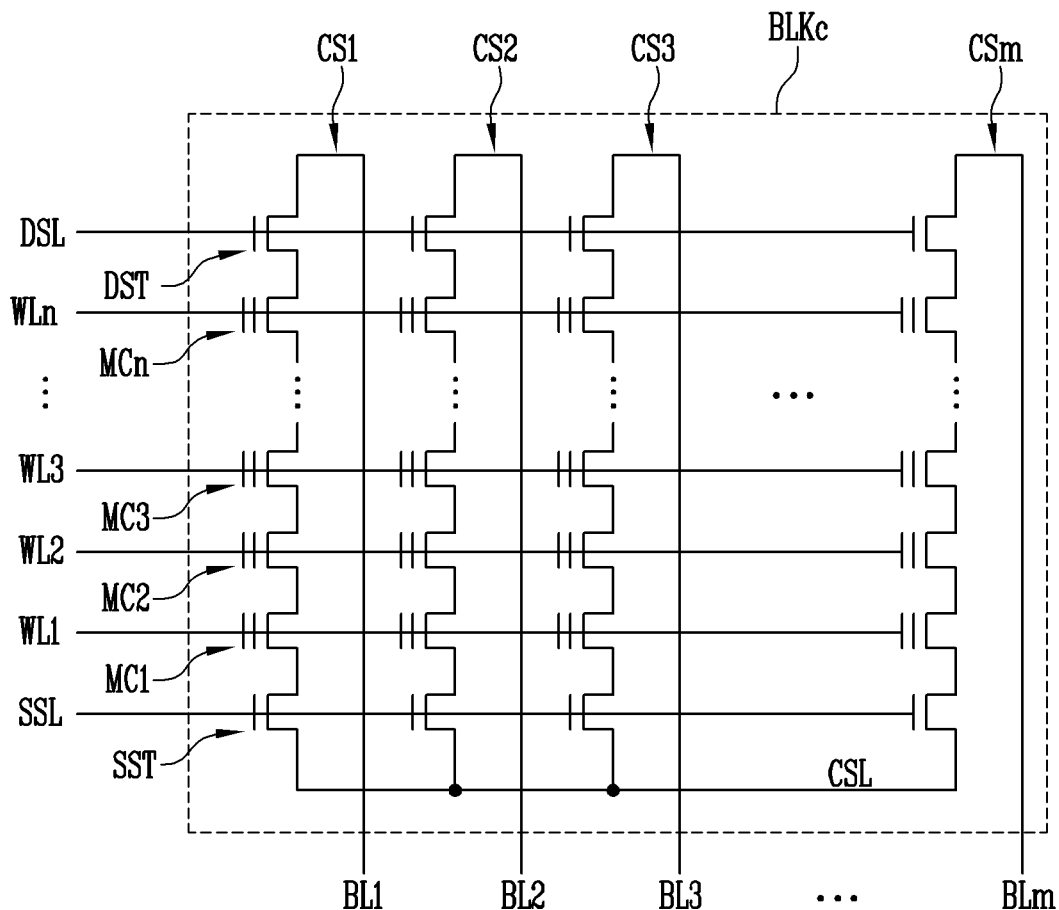
FIG. 6 is a circuit diagram illustrating an embodiment of any one memory block BLKc of the memory blocks BLK1 to BLKz of the memory cell array of FIG. 2.

FIG. 6 is a circuit diagram illustrating an embodiment of any one memory block BLKc of the memory blocks BLK1 to BLKz included in the memory cell array 110 of FIG. 2.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating film, a charge storage film, and a blocking insulating film. In an embodiment, a pillar for providing the channel layer may be provided in each cell string. In an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

In another embodiment, even bit lines and odd bit lines may be provided instead of the first to m-th bit lines BL1 to BLm. Even-numbered cell strings among the cell strings CS1 to CSm may be connected to even bit lines, and odd-numbered cell strings may be connected to odd bit lines, respectively.

Figure 7:
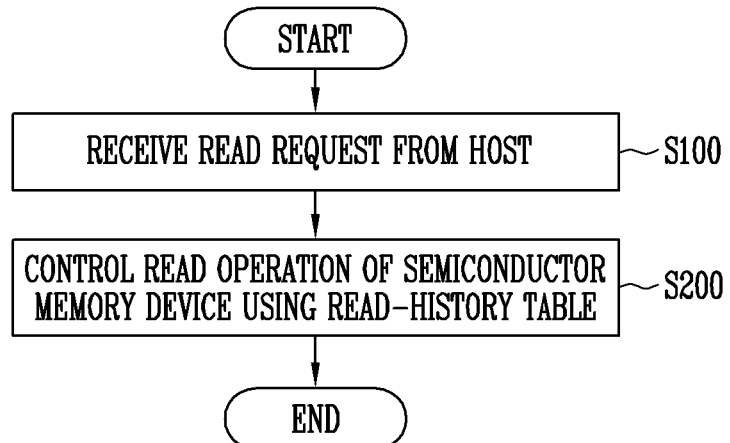
FIG. 7 is a flowchart illustrating a method of operating a controller according to an embodiment.

FIG. 7 is a flowchart illustrating a method of operating the controller according to an embodiment.

Referring to FIG. 7, the method of operating the controller 200 according to an embodiment of the present disclosure includes receiving a read request from a host (S100) and controlling the read operation of the semiconductor memory device using the RHT (S200).

In step S100, the memory system 1000 receives the read request from the host. More specifically, the controller 200 of the memory system 1000 receives the read request from the host. The controller 200 may receive a logical address in which the read data is stored from the host together with the read request. The controller 200 may convert the received logical address to a physical address. In step S200, the controller 200 may control the semiconductor memory device 100 to read data corresponding to the received read request based on the converted physical address.

In step S200, the controller 200 may control the read operation of the semiconductor memory device by using the RHT stored in the RHT storage 250. Details of step S200 are described below with reference to FIGS. 8 to 9C.

Figure 8:
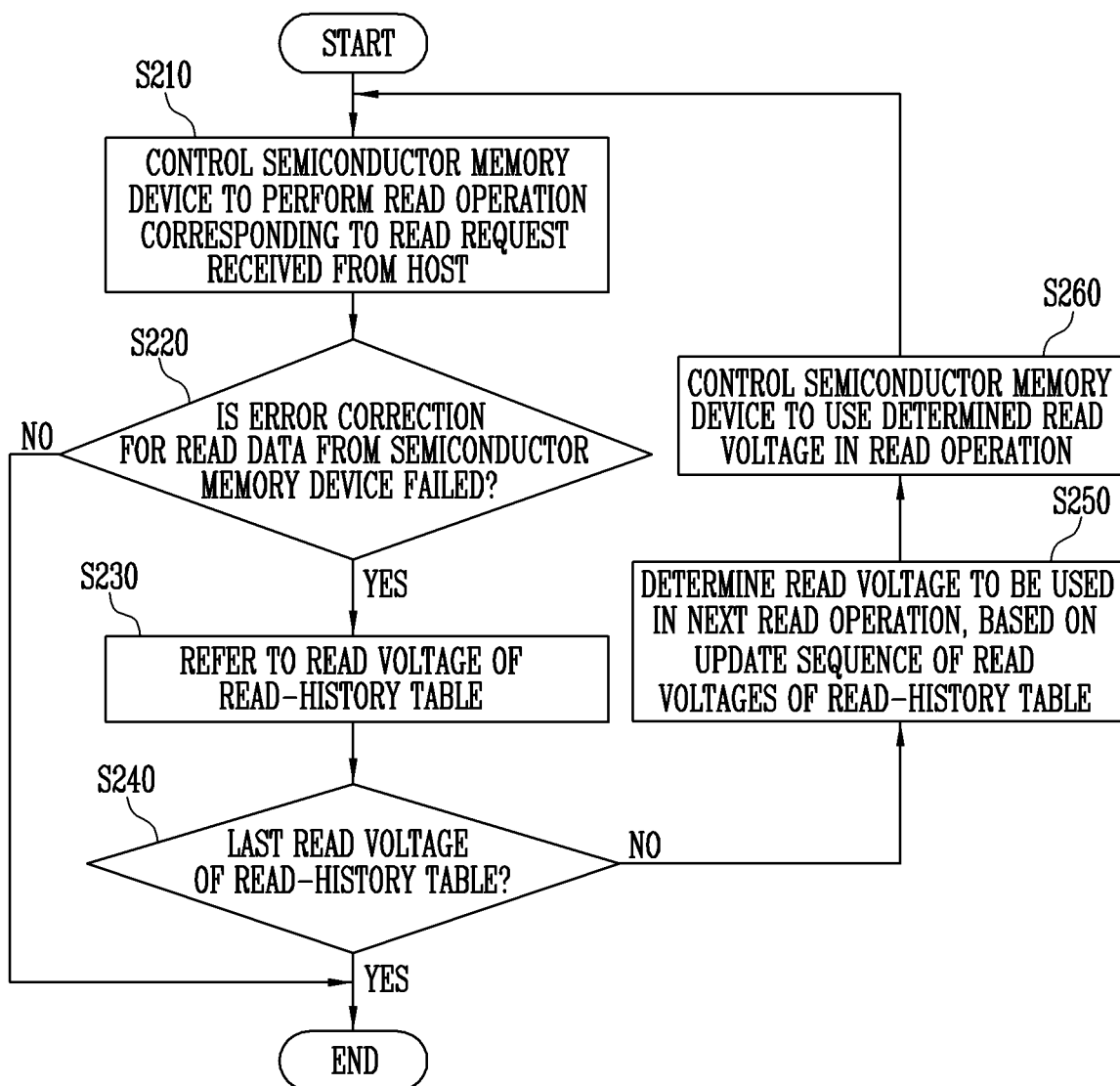
FIG. 8 is a flowchart illustrating the operation method of FIG. 7 in more detail.

FIG. 8 is a flowchart illustrating the operation method of FIG. 7 in more detail. Referring to FIG. 8, a detailed configuration of step S200 of FIG. 7 is shown. That is, according to an embodiment of the present disclosure, step S200 of FIG. 7 includes steps S210, S220, S230, S240, S250, and S260 shown in FIG. 8.

The controller 210 controls the semiconductor memory device 100 to perform the read operation corresponding to the read request received from the host (S210). To this end, the controller 200 may transfer the read command and a physical address corresponding thereto to the semiconductor memory device 100. The semiconductor memory device 100 may perform a read operation on a page corresponding to the received physical address based on a currently set read voltage, and transfer the read data to the controller 200.

In step S220, the error correction block 230 of the controller 200 performs an error correction operation on the read data received from the semiconductor memory device 100. When an error correction is successful as an error correction result (S220: No), the read data may be transferred to the host and the read operation may be ended.

When it is determined that the error correction failed (S220: Yes), the read voltage controller 210 refers to read voltage(s) included in the RHT stored in the RHT storage 250 (S230). In step S230, the read voltage which is currently set in the semiconductor memory device 100 is compared with a last read voltage among the read voltages included in the RHT.

When the read voltage set in the semiconductor memory device is not the last read voltage among the read voltages in the RHT (S240: No), the method proceeds to step S250. In step S250, a read voltage to be used for a next read operation is determined based on an update sequence of the read voltages included in the RHT. As the error correction failure is repeated as a result of the determination of step S220, the read voltage to be used for the next read operation is determined in step S250 by selecting the read voltages in a sequence from the most recently updated read voltage to the least recently updated read voltage among the read voltages in the RHT. A specific example of a method of determining the read voltage in step S250 is described below with reference to FIGS. 9A to 9C.

In step S260, the read voltage controller 210 controls the semiconductor memory device to use the determined read voltage for the read operation. In step S260, the read voltage controller 210 may set the read voltage used for the read operation of the semiconductor memory device 100 using a set-parameter command. Thereafter, the method proceeds to step S210 again, and controls the semiconductor memory device 100 to perform the read operation corresponding to the read request received from the host.

As a result of the determination in step S240, when the read voltage set in the semiconductor memory device is the last read voltage among the read voltages included in the RHT (S240: Yes), this means that the error correction failure occurred using all of the read voltages stored in the RHT. Therefore, in this case, the read operation ends.

Figure 9A:
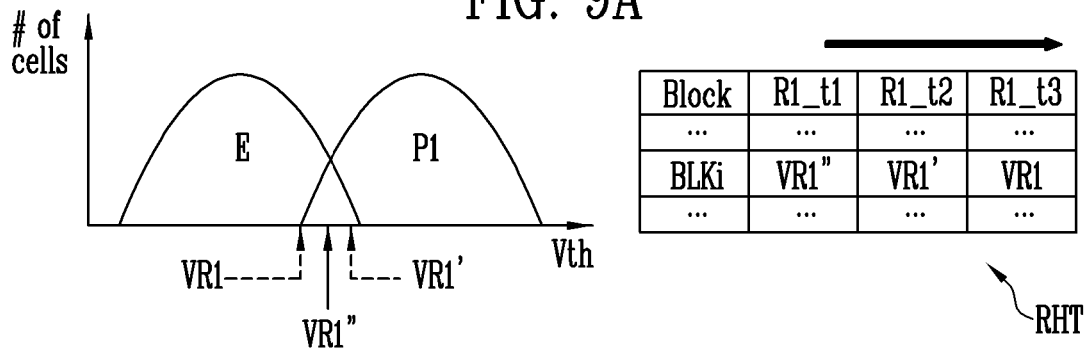
FIGS. 9A, 9B, and 9C are diagrams for describing an embodiment in which a read operation is performed with reference to a read history table (RHT), with respect to a memory block including a single-level cell (SLC).
Figure 9B:
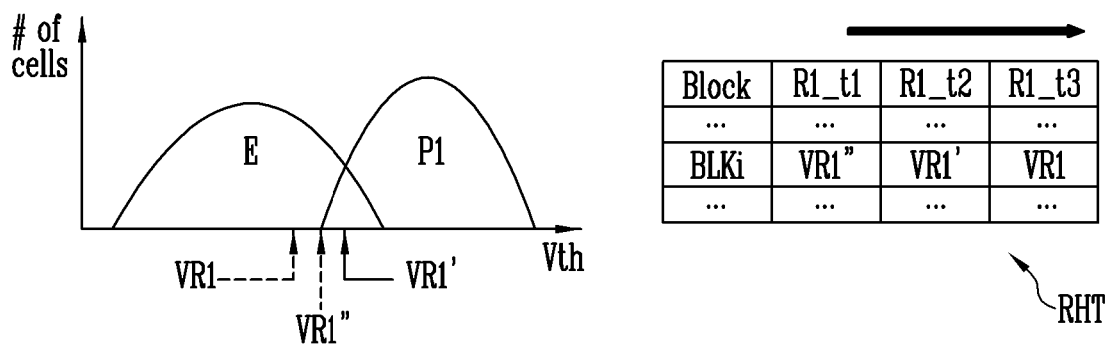
Figure 9C:
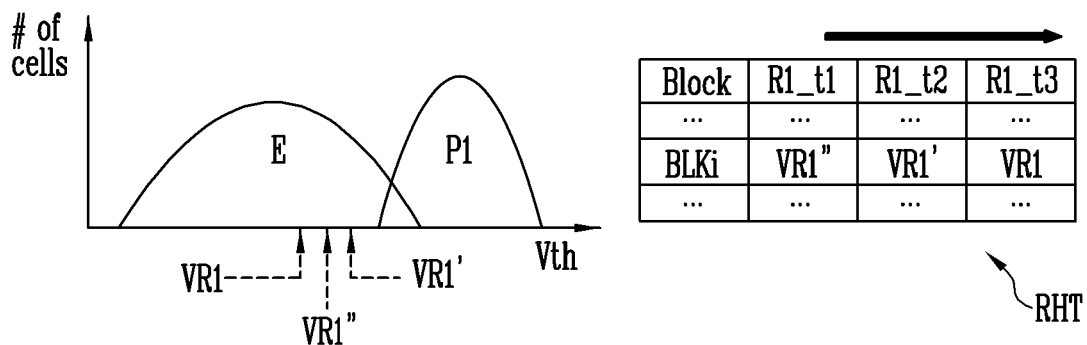

FIGS. 9A, 9B, and 9C are diagrams for describing an embodiment in which the read operation is performed with reference to the RHT, with respect to the memory block including single-level cells (SLCs). First, referring to FIG. 9A, an RHT including a threshold voltage distribution of the SLCs and read voltages for reading the SLCs is shown. Hereinafter, description is given with additional reference to FIG. 8.

The SLC has, as a threshold voltage state, any one of an erase state E and a program state P1. The RHT includes three read voltages for each of the plurality of memory blocks BLK1 to BLKz included in the semiconductor memory device 100. In FIGS. 9A to 9C, for convenience, only read voltages of an i-th memory block BLKi including a page to be read among the plurality of memory blocks BLK1 to BLKz are shown. The threshold voltage distribution shown in FIGS. 9A to 9C is a threshold voltage distribution of the memory cells included in the page to be read. Referring to the RHT, read voltages VR1", VR1', and VR1 corresponding to a plurality of read operations R1_t1, R1_t2, and R1_t3, respectively, are shown. The plurality of read operations R1_t1, R1_t2, and R1_t3 included in the RHT are the three most recent read operations. More specifically, the read operation R1_t1 indicates the most recently read-passed read operation, that is, the most recently updated read voltage. Therefore, the read voltage used in the most recent read-passed read operation for the i-th memory block BLKi is VR1".

The read operation R1_t2 indicates the second most recently read-passed read operation. Therefore, the read voltage used in the most recent read-passed read operation before the read operation R1_t1 for the i-th memory block BLKi is VR1'. That is, the read voltage VR1' is a secondly updated read voltage in the RHT among the three read voltages VR1", VR1', and VR1.

Finally, the read operation R1_t3 indicates the third most recently read-passed read operation. Therefore, the read voltage used in the most recent read-passed read operation before the read operation R1_t2 for the i-th memory block BLKi is VR1. That is, the read voltage VR1 is a read voltage initially updated in the RHT among the three read voltages VR1", VR1', and VR1.

In summary, the read voltage VR1 was used in the first performed read operation R1_t3 among the recent three read-passed read operations for the i-th memory block BLKi, the read voltage VR' was used in the next read-passed read operation R1_t2, and the read voltage VR" was used in the most recently performed read-passed read operation R1_t1.

Whenever step S250 is repeatedly performed, the read voltages are selected in a sequence indicated by an arrow direction above the RHT. That is, when the error correction failure for the read data initially occurs in step S220, in step S250 performed thereafter, the read voltage VR1" used in the most recently performed read-passed read operation R1_t1 is determined as a read voltage to be used in the next read operation. Referring to FIG. 9A, the read voltage VR1" is a read voltage existing in a valley between the erase state E and the program state P1, and is a read voltage that generates least error. Therefore, according to the threshold voltage distribution shown in FIG. 9A, the error correction for the read data may be successful (S220: Yes) as a result of performing the read operation based on the read voltage VR1" selected after the initial error correction failure. If so, the read operation ends.

FIG. 9B shows a threshold voltage distribution different from that of FIG. 9A. The RHT shown in FIG. 9B is the same as the RHT shown in FIG. 9A. When the error correction failure for the read data initially occurs in step S220, as described above, in step S250 performed thereafter, the read voltage VR1" used in the most recently performed read-passed read operation R1_t1 may be determined as the read voltage to be used in the next read operation. Referring to FIG. 9B, the read voltage VR1" is significantly apart from the valley between the erase state E and the program state P1, and is a read voltage that generates a relatively large amount of errors. Therefore, according to the threshold voltage distribution shown in FIG. 9B, as a result of performing the read operation based on the selected voltage VR1" after the error correction failure, the error correction for the read data may fail again (S220: Yes). Accordingly, the RHT is referred to (S230), and it is determined whether the read voltage VR1" currently set in the semiconductor memory device 100 is the last read voltage VR1 of the RHT (S240). The last read voltage of the RHT may be the read voltage VR1 used during the initially read-passed read operation R1_t3 among the read voltages VR1", VR1', and VR1 in the RHT. Since the read voltage VR1" currently set in the semiconductor memory device 100 is different from the last read voltage VR1 of the RHT, the method proceeds to step S250 to determine the read voltage to be used in the next read operation. In step S250, the read voltage VR' used in the second read-passed read operation R1_t2 may now be determined as the read voltage to be used in the next read operation. Referring to FIG. 9B, the read voltage VR1' exists in the valley between the erase state E and the program state P1, and is a read voltage that generates the least error. Therefore, according to the threshold voltage distribution shown in FIG. 9B, as a result of performing the read operation based on the voltage VR1' selected after the second error correction failure, the error correction for the read data may be successful (S220: Yes). If so, the read operation ends.

FIG. 9C shows a threshold voltage distribution different from that of FIG. 9A or 9B. The RHT shown in FIG. 9C is the same as the RHT shown in FIGS. 9A and 9B. When the error correction failure for the read data initially occurs in step S220, as described above, in step S250 performed thereafter, the read voltage VR1" used in the most recently performed read-passed read operation R1_t1 may be determined as the read voltage to be used in the next read operation. Referring to FIG. 9C, as a result of performing the read operation by the read voltage VR1", the error correction for the read data may fail. When the second error correction failure occurs as described above, in step S250 performed thereafter, the read voltage VR1' used in the second performed read-passed read operation R1_t2 may be determined as the read voltage to be used in the next read operation. Referring to FIG. 9C, as a result of the performance the read operation by the read voltage VR1, the error correction for the read data may fail. When a third error correction failure occurs, in step S250 performed thereafter, the read voltage VR1 used in the initially performed read-passed read operation R1_t3 among the read operations R1_t1, R1_t2, and R1_t3 included in the RHT may be determined as the read voltage to be used in the next read operation. Referring to FIG. 9C, as a result of performing the read operation by the read voltage VR1, the error correction for the read data may fail.

Therefore, as a result of the determination of the subsequent step S240, since the read voltage currently set in the semiconductor memory device 100 is the same as the last read voltage VR1 in the RHT, the read operation ends. This means that the error correction is failed even though the read operation was repeatedly performed sequentially using all read voltages in the RHT. Therefore, the read operation corresponding to the read request received from the host may be deemed to have finally failed.

As described above, according to an embodiment of the present disclosure, the RHT stored in the RHT storage includes the read voltages used in previous read-passed read operations. Whenever the error correction failure is repeated during the read operation, the controller controls the semiconductor memory device 100 to sequentially select from the most recently updated read voltage VR1" to the initially updated read voltage VR1 among the plurality of read voltages in the RHT to use the read voltages in the read operation of the semiconductor memory device 100.

Accordingly, since the read voltages are sequentially used in the read operation from the read voltage VR1" used in the most recent read-passed operation, a probability of success in the error correction is increased. Accordingly, performance of the memory system including the semiconductor memory device 100 and the controller 200 is improved.

The RHT shown in FIGS. 9A to 9C includes the three read voltages VR1", VR', and VR1 for each memory block. This means that the read voltages for the three most recently read-passed read operations R1_t1, R1_t2, and R1_t3 are included in the RHT. In the present specification, the number of read voltages included in the RHT, and hence the number of times the read operation is retried, is defined as a "depth of the RHT". In the embodiment shown in FIGS. 9A to 9C, the RHT includes 3 read voltages, respectively corresponding to three read-passed read operations, and thus the depth of the RHT is 3. However, this is merely an example, and the depth of the RHT may be variously determined as necessary. When the depth of the RHT is increased, read voltages corresponding to more read-passed read operations are stored in the RHT. Therefore, while the read performance may be improved, a capacity of the RHT storage 250 for storing the RHT is increased. On the other hand, when the depth of the RHT is decreased, read voltages corresponding to fewer read-passed read operations are included in the RHT. Accordingly, while the capacity of the RHT storage 250 is required less, the read performance may be somewhat decreased. Thus, the depth of the RHT may be set with this trade-off taken into account.

Figure 10:
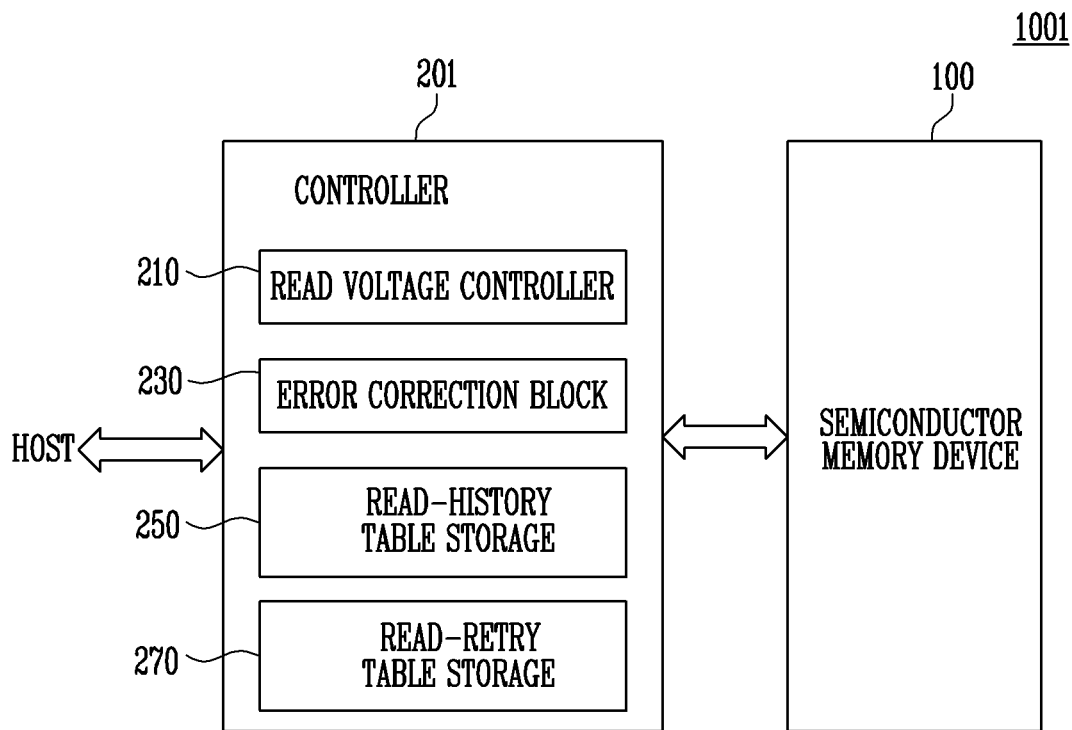
FIG. 10 is a block diagram illustrating a memory system including a controller according to another embodiment of the present disclosure.

FIG. 10 is a block diagram illustrating a memory system including a controller according to another embodiment of the present disclosure.

Referring to FIG. 10, the memory system 1001 includes the semiconductor memory device 100 and the controller 201. The semiconductor memory device 100 of FIG. 10 is the same or substantially the same as the semiconductor memory device 100 described with reference to FIGS. 1 and 2.

The controller 201 includes the read voltage controller 210, the error correction block 230, the RHT storage 250, and a read-retry table storage 270. The controller 201 shown in FIG. 10 is the same or substantially the same as the controller 200 shown in FIG. 1, except that the controller 201 further includes the read-retry table storage 270.

The read-retry table storage 270 stores a read-retry table (RRT). The RRT includes a set number of read voltages, which number may be determined in advance. As the error correction failure for the same data is repeated, the read voltage controller 210 repeats the read operation by sequentially applying the read voltages stored in the RRT. The RRT and the read operation using the same are widely known in the technical field of the present disclosure, and thus description thereof is omitted.

In accordance with the controller 201 according to another embodiment of the present disclosure, the read voltage controller 210 first performs the read operation using the RHT when error correction failure occurs for the read data, and nevertheless, when the error correction failure repeatedly occurs using all read voltages in the RHT, read voltage controller 210 may perform the read operation using the RRT. A method of operating the controller 201 according to another embodiment of the present disclosure is described below with reference to FIGS. 11 to 13D.

Figure 11:
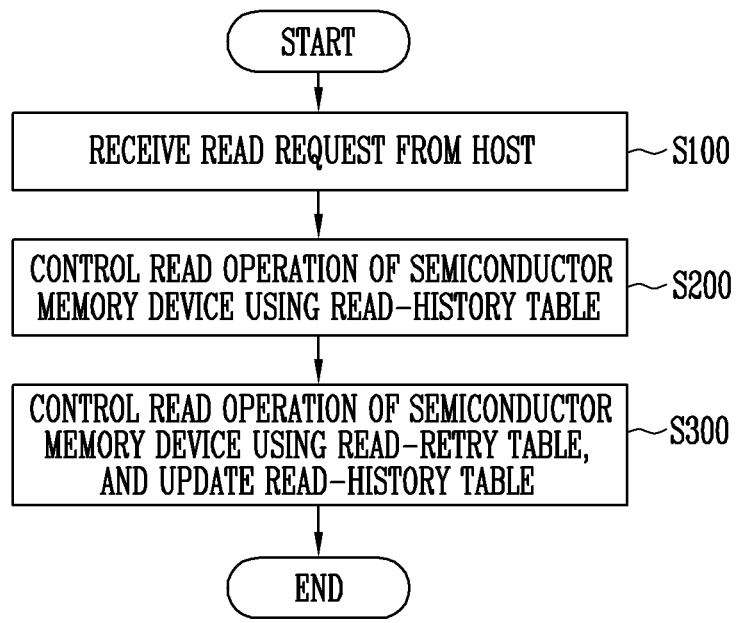
FIG. 11 is a flowchart illustrating a method of operating the controller according to the embodiment of FIG. 10.

FIG. 11 is a flowchart illustrating the method of operating the controller according to the embodiment of FIG. 10.

Referring to FIG. 11, the method of operating the controller 201 according to the embodiment of FIG. 10 includes receiving the read request from the host (S100), controlling the read operation of the semiconductor memory device using the RHT (S200), and controlling the read operation of the semiconductor memory device using the RTT and updating the RHT (S300).

In step S100, the memory system 1000 receives the read request from the host. More specifically, the controller 201 of the memory system 1000 receives the read request from the host. The controller 201 may receive the logical address in which the read data is stored from the host together with the read request. The controller 201 may convert the received logical address to the physical address. In steps S200 and S300, the controller 201 may control the semiconductor memory device 100 to read the data corresponding to the received read request based on the converted physical address.

In step S200, the controller 201 may control the read operation of the semiconductor memory device using the RHT stored in the RHT storage 250. Step S200 may include steps S210, S220, S230, S240, S250, and S260 shown in FIG. 8. That is, step S200 of FIG. 11 may be performed the same or substantially the same as that described with reference to FIGS. 8 to 9C.

As a result of repeatedly performing the read operation in step S200, when the error correction for the read data repeatedly fails, a read operation using an additional read method may be performed. In the embodiment of FIG. 11, the additional read method may be a read method using the RRT.

According to the embodiment of FIG. 11, step S300 is performed as the additional read method. More specifically, when the error correction failure occurs as a result of performing the read operation using all read voltages VR1", VR1', and VR1 in the RHT, step S200 ends and step S300 is performed. When the error correction is successful with respect to the read data while step S200 is performed, the read operation may end and step S300 may not be performed. Hereinafter, description is given in more detail with reference to FIG. 12.

Figure 12:
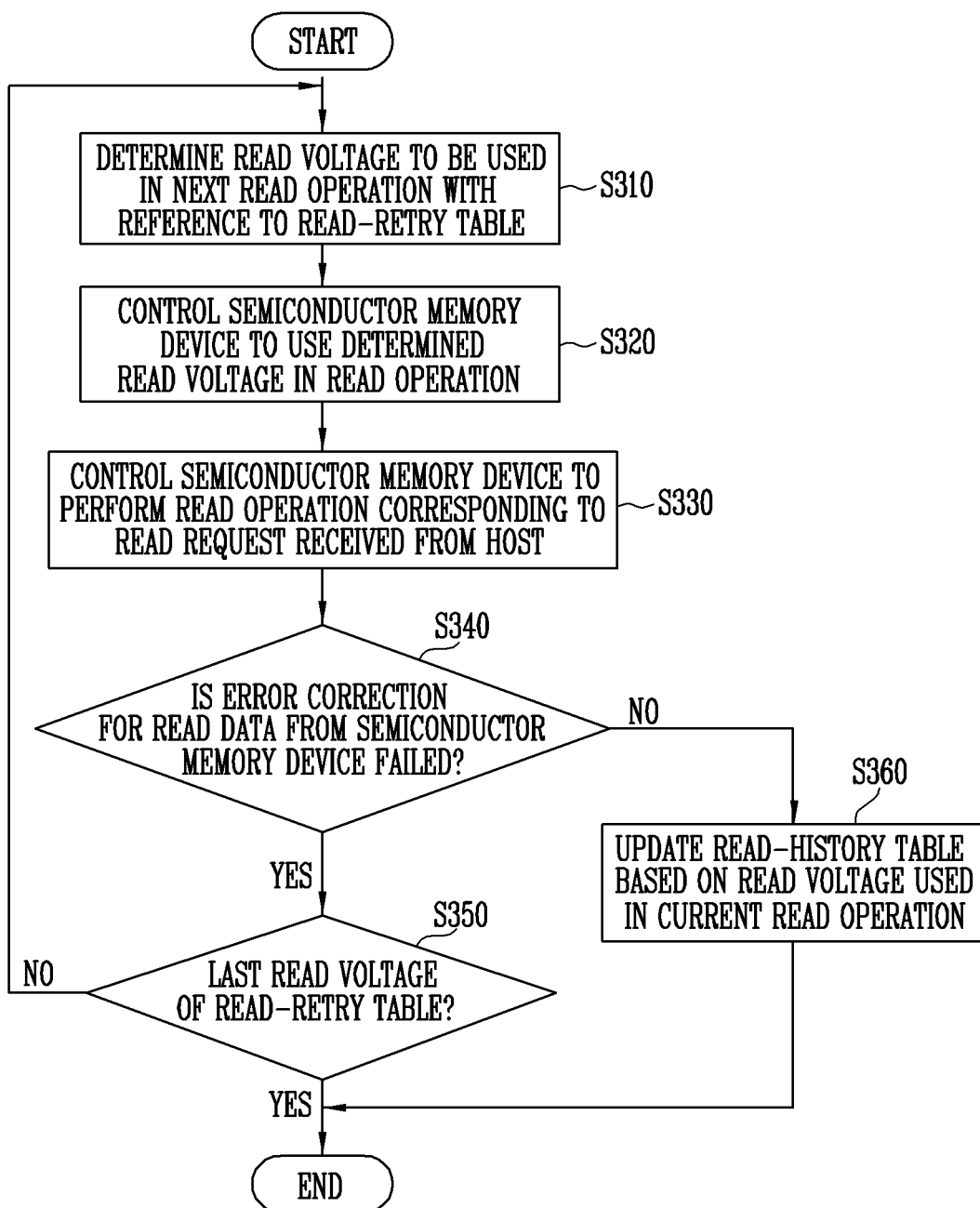
FIG. 12 is a flowchart illustrating the operation method of FIG. 11 in more detail.

FIG. 12 is a flowchart illustrating the operation method of FIG. 11 in more detail.

Referring to FIG. 12, when the read operation using the read voltage included in the RHT fails, the read voltage to be used in the next read operation is determined with reference to the RRT (S310). In this case, a first read voltage of the RRT may be determined as the read voltage to be used in the next read operation.

Thereafter, the semiconductor memory device is controlled to use the determined read voltage in the read operation (S320). In step S320, the read voltage controller 210 may set the read voltage used in the read operation of the semiconductor memory device 100 using the set-parameter command.

Thereafter, the semiconductor memory device 100 is controlled to perform the read operation corresponding to the read request received from the host (S330). Accordingly, the read operation may be performed using the first read voltage in the RRT.

In step S340, it is determined whether the error correction failure occurs with respect to the read data to be received from the semiconductor memory device 100 (S230). When the error correction failed (S340: Yes), it is determined whether the read voltage currently used in the read operation is the last read voltage in the RRT (S350). Since the read operation is performed using the first read voltage of the current RRT (S350: No), the method proceeds to step S310 to determine a second read voltage of the RRT as the read voltage to be used in the next read operation, and the read operation is repeatedly performed (S310). Accordingly, when the error correction failure is repeated, the read operation may be performed using all read voltages up to the last read voltage in the RRT.

When the error correction is determined to have been successful (S340: No), error corrected data may be transferred to the host. In this case, the RHT is updated based on the read voltage used in the current read operation (S360). The success of the error correction means that the currently performed read operation is now the most recently read-passed read operation. Therefore, the read voltage used in the current read operation is added to the RHT as the most recently successful read voltage. The updated RHT may be used in a read operation corresponding to a next read request from the host.

FIGS. 13A, 13B, 13C, and 13D are diagrams exemplarily describing the update of the RHT. In an initial state, the RHT may not include any read voltage.

Figure 13A:
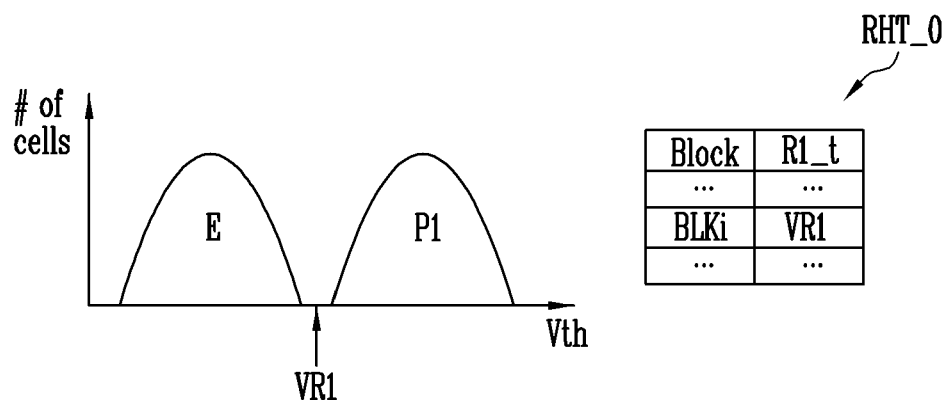
FIGS. 13A, 13B, 13C, and 13D are diagrams exemplarily describing update of the RHT.

Referring to FIG. 13A, the read voltage VR1 is used in a read operation of a first page included in the i-th memory block BLKi by a first request from the host. The read voltage VR1 may be a voltage included in the RRT. As the read data is successful in the error correction by the read voltage VR1 (S340: No), the read voltage used in a read pass may be updated in an RHT, denoted RHT_0 (S360).

Figure 13B:
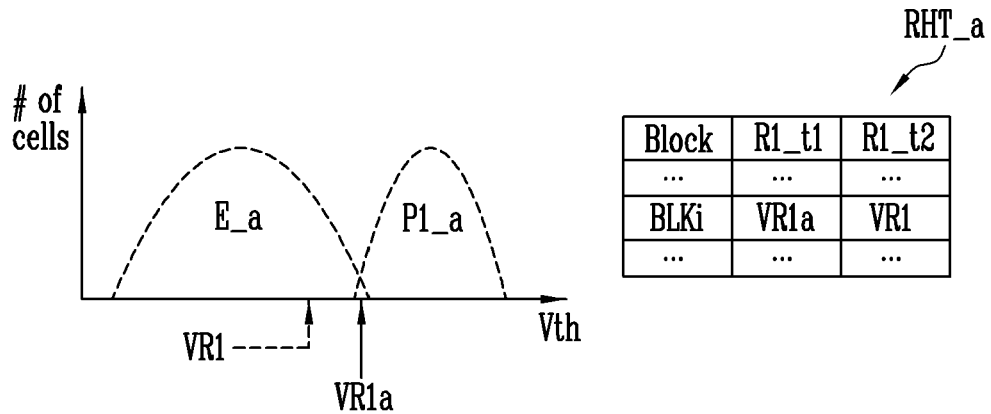

Referring to FIG. 13B, a read operation on a second page included in the i-th memory block BLKi may be performed by a second request from the host. In this case, the read operation of the semiconductor memory device is first controlled using the previously updated RHT_0 according to step S200 of FIG. 11. According to the threshold voltage distribution of FIG. 13B, when the read operation is performed using the read voltage VR1 included in the RHT_0 of FIG. 13A, the error correction failure may occur. Accordingly, the process proceeds to step S300 of FIG. 11 to control the read operation of the semiconductor memory device using the RRT.

In the example of FIG. 13B, it is assumed that a read voltage VR1$a$ is included among a plurality of read voltages in the RRT. In a process of repeatedly performing the read operation using the plurality of read voltages included in the RRT, the read operation may be performed by the read voltage VR1$a$. Accordingly, the error correction may be successful in step S340 of FIG. 12 (S340: No). As the read data is successful in the error correction by the read voltage VR1$a$, the read voltage used in the read pass may be updated in the RHT_0 (S360). Accordingly, the RHT is updated based on the read voltage VR1$a$ used in the current read operation. More specifically, the read voltage VR1$a$ is added to the RHT_0 shown in FIG. 13A to generate an updated RHT, denoted RHT_a. Referring to the updated RHT (RHT_a), the read voltage VR1$a$ used in the most recently performed read-passed read operation R1_t1 and the read voltage VR1 used in the read-passed read operation R1_t2 performed therebefore, that is, used in FIG. 13A are included.

Figure 13C:
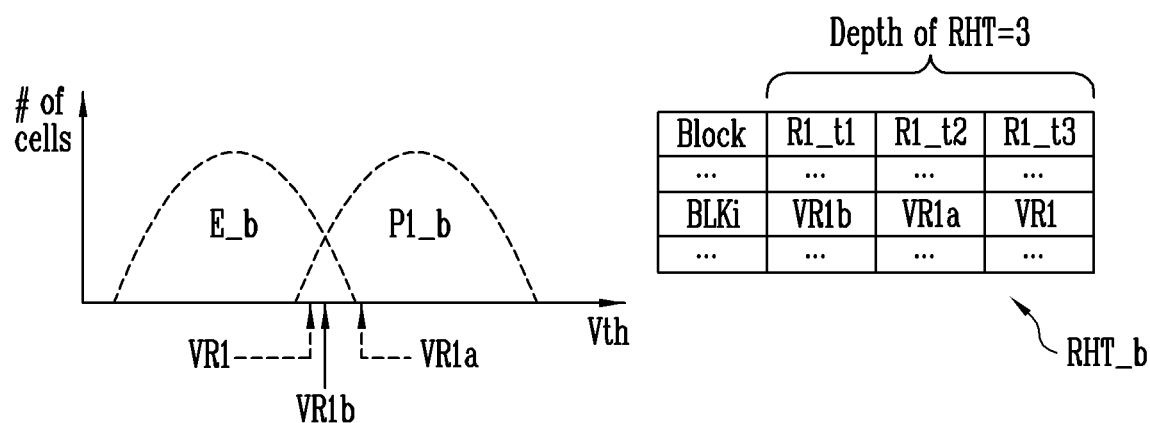

Referring to FIG. 13C, a read operation on a third page included in the i-th memory block BLKi may be performed by a third request from the host. In this case, the read operation of the semiconductor memory device is first controlled using the previously updated RHT_a according to step S200 of FIG. 11. In step S200, the read operation may be performed sequentially using the read voltages VR1$a$ and VR1 included in the RHT_a of FIG. 13B. According to the threshold voltage distribution of FIG. 13C, when the read operation is performed using the read voltages VR1$a$ and VR1 included in the RHT_a, the error correction failure may repeatedly occur. Accordingly, the process proceeds to step S300 of FIG. 11 to control the read operation of the semiconductor memory device using the RRT.

In the example of FIG. 13C, it is assumed that a read voltage VR1$b$ is included among the plurality of read voltages included in the RRT. In the process of repeatedly performing the read operation using the plurality of read voltages included in the RRT, the read operation may be performed by the read voltage VR1$b$. Accordingly, the error correction may be successful in step S340 of FIG. 12 (S340: No). As the read data is successful in the error correction by the read voltage VR1$b$, the read voltage used in the read pass may be updated in the RHT_a. Accordingly, the RHT is updated based on the read voltage VR1$b$ used in the current read operation. More specifically, the read voltage VR1$b$ is added to the RHT_a shown in FIG. 13B to generate an updated RHT, denoted RHT_b. Referring to the updated RHT (RHT_b), the read voltage VR1$b$ used in the most recently performed read-passed read operation R1_t1 and the read voltage VR1 used in the first performed read-passed read operation R1_t3 are included.

Referring to FIG. 13C, since the depth of the RHT_b is 3, three read voltages VR1$b$, VR1$a$, and VR1 for the i-th memory block BLKi are included in the RHT_b.

Figure 13D:
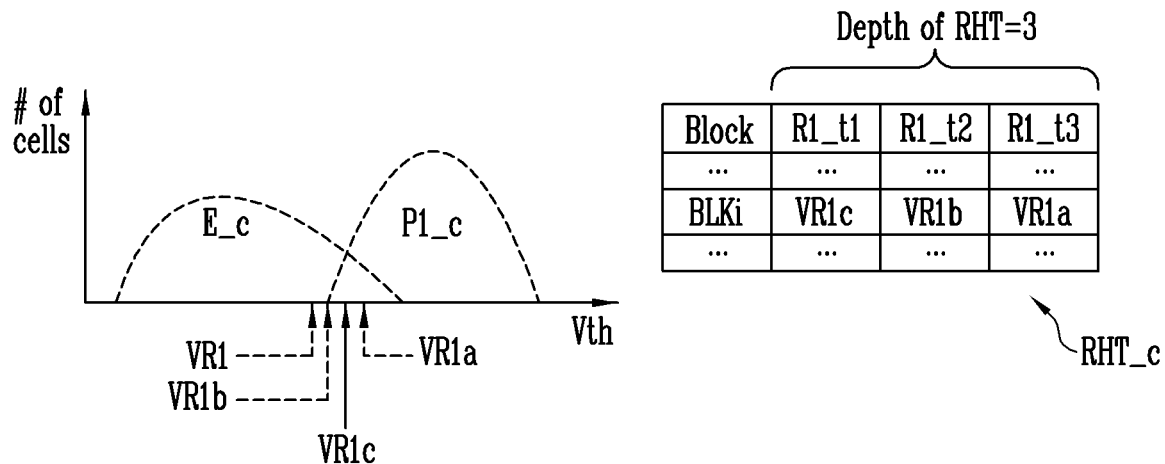

Referring to FIG. 13D, a read operation on a fourth page included in the i-th memory block BLKi may be performed by a fourth request from the host. In this case, the read operation of the semiconductor memory device is first controlled using the previously updated RHT_b according to step S200 of FIG. 11. In step S200, the read operation may be performed sequentially using the read voltages VR1$b$, VR1$a$, and VR1 included in the RHT_b of FIG. 13C. According to the threshold voltage distribution of FIG. 13C, when the read operation is performed using the read voltages VR1$b$, VR1$a$, and VR1 included in the RHT_b, the error correction failure may repeatedly occur. Accordingly, the process proceeds to step S300 of FIG. 11 to control the read operation of the semiconductor memory device using the RRT.

In the example of FIG. 13D, it is assumed that a read voltage VR1$c$ is included among the plurality of read voltages included in the RRT. In the process of repeatedly performing the read operation using the plurality of read voltages included in the RRT, the read operation may be performed by the read voltage VR1$c$. Accordingly, the error correction may be successful in step S340 of FIG. 12 (S340: No). As the read data is successful in the error correction by the read voltage VR1$c$, the read voltage used in the read pass may be updated in the RHT_b. Accordingly, the RHT is updated based on the read voltage VR1$c$ used in the current read operation. More specifically, the read voltage VR1$c$ is added to the RHT_b shown in FIG. 13C to generate an updated RHT, denoted RHT_c.

The maximum depth of the RHT may be 3, in which case since the depth of the RHT_b is 3, to add the new read voltage VR1$c$, one of the three read voltages VR1$b$, VR1$a$, VR1 currently in the RHT_b is required to be removed. In an embodiment of the present disclosure, the least recently updated read voltage, which is read voltage VR1, is removed. Accordingly, the updated RHT_c includes the read voltages VR1$c$, VR1$b$, and VR1$a$ used in the three most recent read-passed read operations R1_t1, R1_t2, and R1_t3.

Figure 14:
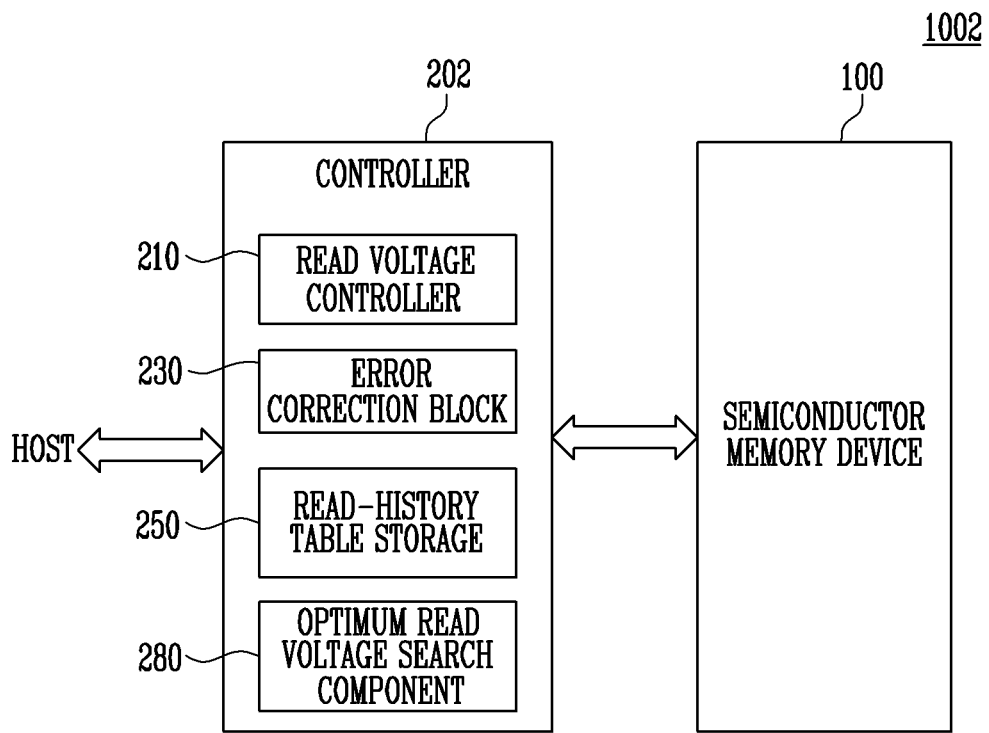
FIG. 14 is a block diagram illustrating a memory system including a controller according to still another embodiment of the present disclosure.

FIG. 14 is a block diagram illustrating a memory system including a controller according to still another embodiment of the present disclosure.

Referring to FIG. 14, the memory system 1002 includes the semiconductor memory device 100 and a controller 202. The semiconductor memory device 100 of FIG. 14 is the same or substantially the same as the semiconductor memory device 100 described with reference to FIGS. 1 and 2.

The controller 202 includes the read voltage controller 210, the error correction block 230, the RHT storage 250, and an optimum read voltage search component 280. The controller 202 shown in FIG. 14 is the same or substantially the same as the controller 200 shown in FIG. 1, except that the controller 202 further includes the optimum read voltage search component 280.

The optimum read voltage search component 270 searches for an optimum read voltage based on a threshold voltage distribution of memory cells of a page to be read. More specifically, the optimum read voltage search component 280 controls the semiconductor memory device to repeatedly perform the read operation based on a plurality of reference read voltages, analyzes data corresponding to the plurality of reference read voltages, and searches for a valley between two adjacent threshold voltage states. An optimum read voltage search method of the optimum read voltage search component 280 is described below with reference to FIGS. 16 to 17.

Figure 15:
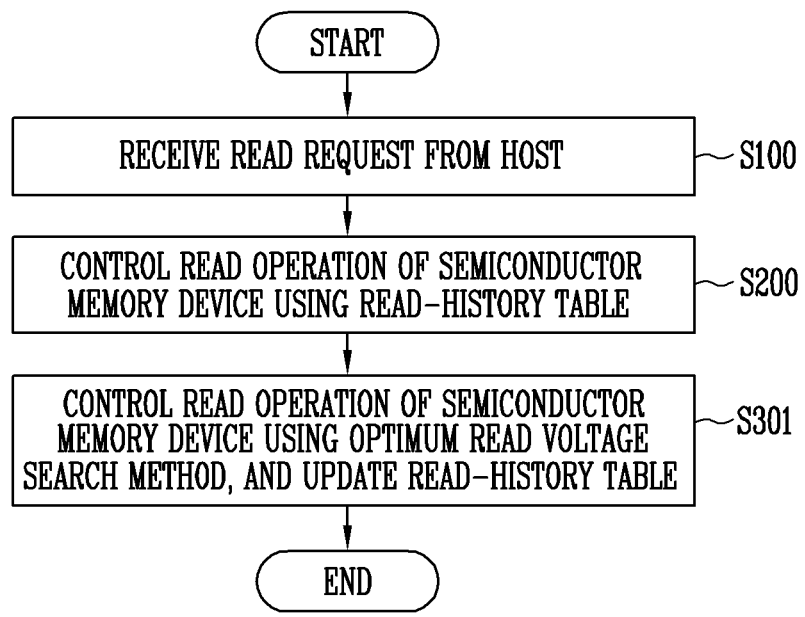
FIG. 15 is a flowchart illustrating a method of operating the controller according to the embodiment of FIG. 14.

FIG. 15 is a flowchart illustrating a method of operating the controller according to the embodiment of FIG. 14.

Referring to FIG. 15, the method of operating the controller 202 according to the embodiment of FIG. 14 includes receiving the read request from the host (S100), controlling the read operation of the semiconductor memory device using the RHT (S200), and controlling the read operation of the semiconductor memory device using the optimum read voltage search method and updating the RHT (S301).

In step S100, the memory system 1000 receives the read request from the host. More specifically, the controller 200 of the memory system 1000 receives the read request from the host. The controller 202 may receive the logical address in which the read data is stored from the host together with the read request. The controller 202 may convert the received logical address to the physical address. In steps S200 and S301, the controller 202 may control the semiconductor memory device 100 to read the data corresponding to the received read request based on the converted physical address.

In step S200, the controller 202 may control the read operation of the semiconductor memory device using the RHT stored in the RHT storage 250. Step S200 may include steps S210, S220, S230, S240, S250, and S260 shown in FIG. 8. That is, step S200 of FIG. 15 may be performed the same or substantially the same as that described with reference to FIGS. 8 to 9C.

As a result of repeatedly performing the read operation in step S200, when the error correction for the read data fails multiple times (e.g., after using all read voltages in the RHT), a read operation using an additional read method may be performed. In the embodiment of FIG. 15, the additional read method may be a read method using the optimum read voltage search method.

According to the embodiment of FIG. 15, step S301 is performed as the additional read method. More specifically, according to control of the optimum read voltage search component 280, the semiconductor memory device 100 repeatedly performs the read operation based on a plurality of reference read voltages. An optimum read voltage corresponding to a valley of the threshold voltage distribution is determined based on a plurality of read results by the plurality of reference read voltages, and the read operation is performed based on the determined optimum read voltage.

A specific embodiment of step S301 is described in more detail with reference to FIGS. 16 and 17.

Figure 16:
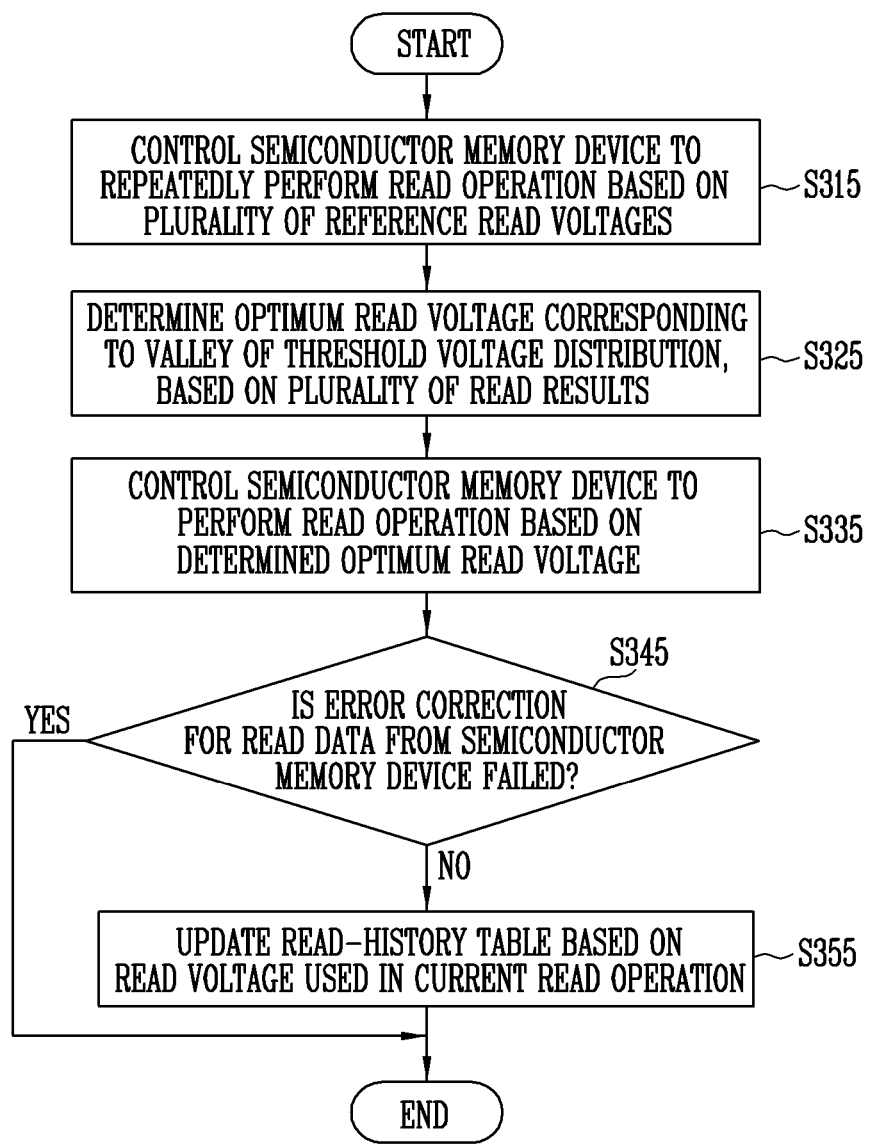
FIG. 16 is a flowchart illustrating the operation method of FIG. 15 in more detail.
Figure 17:
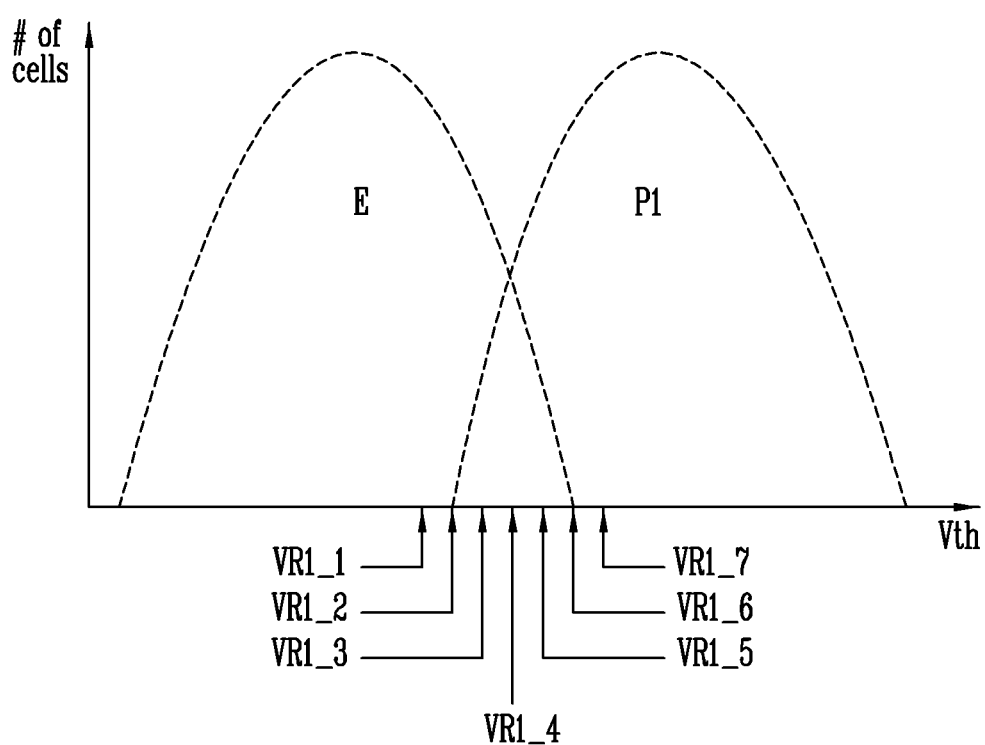
FIG. 17 is a diagram for describing steps S315 and S325 of FIG. 16.

FIG. 16 is a flowchart illustrating the operation method of FIG. 15 in more detail. FIG. 17 is a diagram for describing steps S315 and S325 of FIG. 16. Hereinafter, the method of operating the controller according to an embodiment of the present disclosure is described with reference to FIGS. 16 and 17 together.

Referring to FIG. 16, when the read operation using the read voltage(s) included in the RHT fails, the optimum read voltage search component 280 performs controls the semiconductor memory device 100 to perform the read operation based on a plurality of reference read voltages VR1_1 to VR1_7 (S315). More specifically, the optimum read voltage search component 280 may generate a read command corresponding to the plurality of reference read voltages VR1_1 to VR1_7, transfer the read command to the semiconductor memory device 100, and receive a read result based on the plurality of reference read voltages VR1_1 to VR1_7. According to the example shown in FIG. 17, the read operation is performed based on the plurality of reference read voltages VR1_1 to VR1_7 between the erase state E and the program state P1. Read data as a result of the read operation performed by each of the reference read voltages VR1_1 to VR1_7 may be transferred to the controller 202.

Thereafter, the optimum read voltage search component 280 determines the optimum read voltage corresponding to the valley of the threshold voltage distribution based on a plurality of read results (S325). In the example shown in FIG. 17, the number 1 bits included in data read by a first reference read voltage VR1_1, which number is denoted as N_B1, among the plurality of reference read voltages VR1_1 to VR1_7 may be the number of memory cells having a threshold voltage smaller than that of the first reference read voltage VR1_1 in a threshold voltage distribution of FIG. 17. The number 1 bits included in data read by a second reference read voltage VR1_2, which number is denoted as N_B2, among the plurality of reference read voltages VR1_1 to VR1_7 may be the number of memory cells having a threshold voltage smaller than that of the second reference read voltage VR1_2 in the threshold voltage distribution of FIG. 17. Therefore, the number of memory cells having a threshold voltage between the first and second reference read voltages VR1_1 and VR1_2 may be obtained by subtracting N_B2 from N_B1. In such a manner, the optimum read voltage search component 280 may calculate the number of memory cells included in each of a plurality of sections defined by the plurality of reference read voltages VR1_1 to VR1_7. Thereafter, the optimum read voltage search component 280 may determine sections between VR1_3 and VR1_4 and VR1_4 and VR1_5 that include the least number of memory cells, and may determine the fourth reference read voltage VR1_4 commonly included in such sections may be determined as the optimum read voltage.

Thereafter, the controller 202 controls the semiconductor memory device 100 to perform the read operation based on the determined optimum read voltage (S335). In step S335, the read voltage controller 210 may set the determined optimum read voltage to the read voltage used in the read operation of the semiconductor memory device 100 using the set-parameter command. In addition, in step S335, the controller 202 may transfer the read command corresponding to the read request received from the host to the semiconductor memory device 100. The semiconductor memory device 100 may perform the read operation in response to the received read command. In step S335, the semiconductor memory device 100 may perform the read operation based on the determined optimum read voltage (e.g., VR1_4) and transfer read data to the controller 202.

The error correction block 230 of the controller 202 performs the error correction operation on the read data received from the semiconductor memory device 100. When the error correction for the read data from the semiconductor memory device fails (S345: Yes), the read operation may end.

When the error correction for the read data from the semiconductor memory device is successful (S345: No), the error corrected data may be transferred to the host. Also, in this case, the RHT is updated based on the read voltage used in the current read operation, i.e., VR1_4, (S355). The success of the error correction means that the currently performed read operation is now the most recently read-passed read operation. Therefore, the read voltage used in the current read operation (e.g., VR1_4) is added to the RHT as the most recently successful read voltage. The updated RHT may be used in a read operation corresponding to a next read request from the host.

Figure 18A:
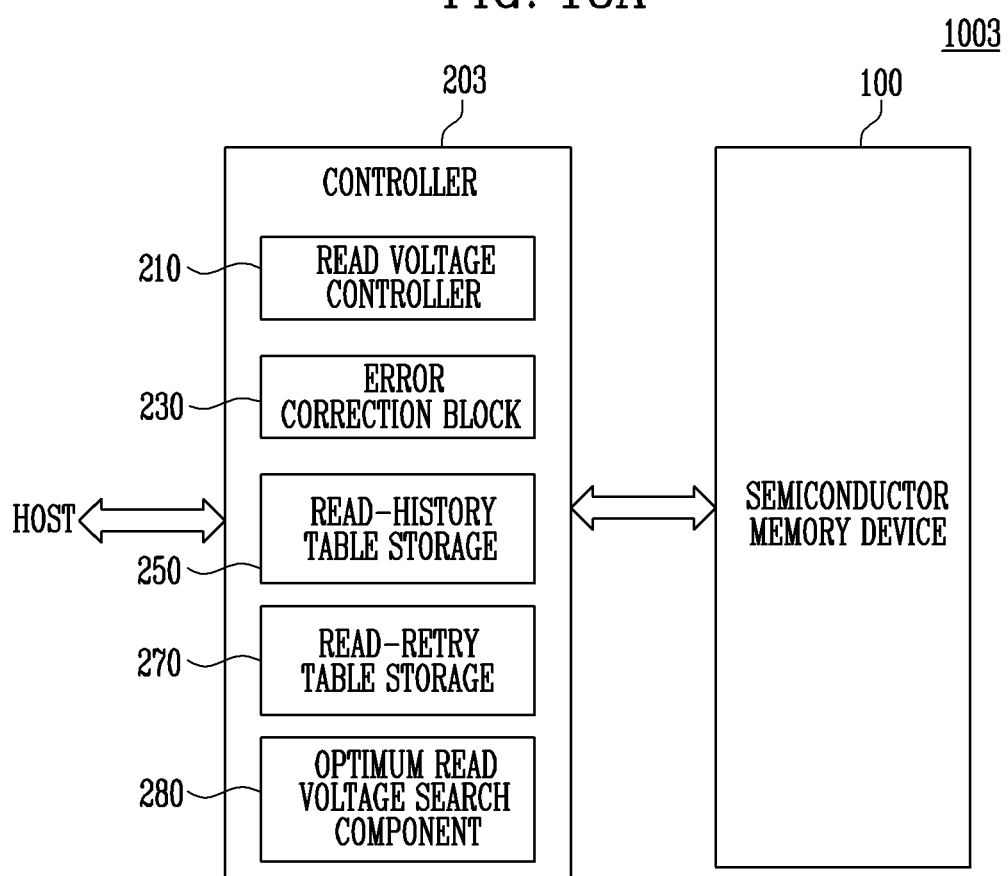
FIG. 18A is a block diagram illustrating a memory system including a controller according to still another embodiment of the present disclosure.

FIG. 18A is a block diagram illustrating a memory system including a controller according to still another embodiment of the present disclosure.

Referring to FIG. 18A, the memory system 1003 includes the semiconductor memory device 100 and a controller 203. The semiconductor memory device 100 of FIG. 18A is the same or substantially the same as the semiconductor memory device 100 described with reference to FIGS. 1 and 2.

The controller 203 includes the read voltage controller 210, the error correction block 230, the RHT storage 250, the RRT storage 270, and the optimum read voltage search component 280. The controller 203 shown in FIG. 18A is the same or substantially the same as the controller 200 shown in FIG. 1, except that the controller 203 further includes the RRT storage 270 and the optimum read voltage search component 280.

The RRT storage 270 of FIG. 18A may be the same or substantially the same as the RRT storage 270 described with reference to FIG. 10. Also, the optimum read voltage search component 280 of FIG. 18A may be the same or substantially the same as the optimum read voltage search component 280 described with reference to FIG. 14. Therefore, description of the RRT storage 270 and the optimum read voltage search component 280 is omitted here.

Figure 18B:
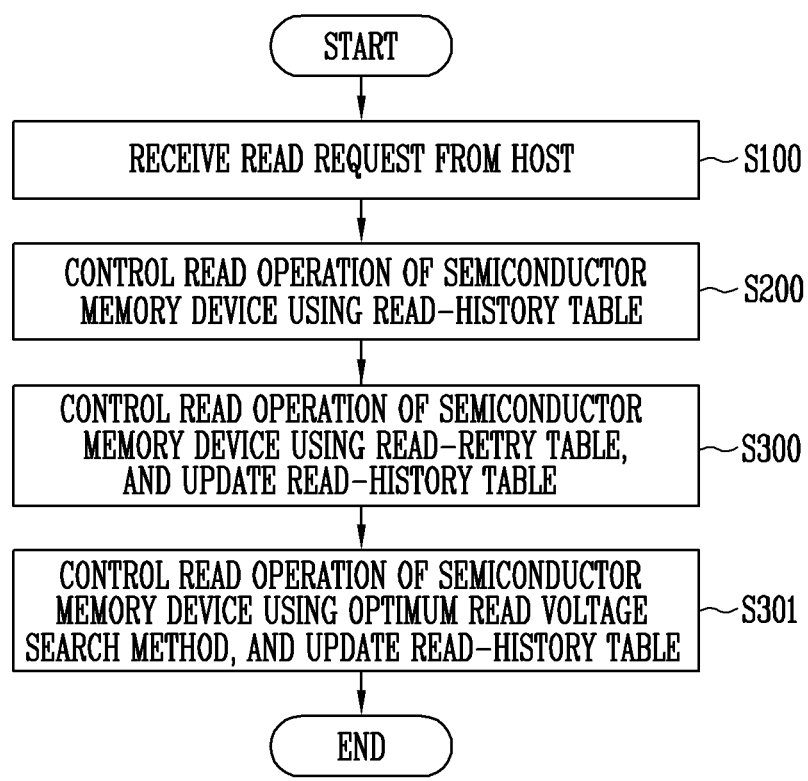
FIG. 18B is a flowchart illustrating a method of operating the controller according to the embodiment of FIG. 18A.

FIG. 18B is a flowchart illustrating a method of operating the controller according to the embodiment of FIG. 18A.

Referring to FIG. 18B, the method of operating the controller 203 according to the embodiment of FIG. 18A includes receiving the read request from the host (S100), controlling the read operation of the semiconductor memory device using the RHT (S200), controlling the read operation of the semiconductor memory device using the RRT and updating the RHT (S300), and controlling the read operation of the semiconductor memory device using the optimum read voltage search method and updating the RHT (S301).

In step S100, the memory system 1000 receives the read request from the host. More specifically, the controller 200 of the memory system 1000 receives the read request from the host. The controller 203 may receive the logical address in which the read data is stored from the host together with the read request. The controller 203 may convert the received logical address to the physical address. In steps S200, S300 and S301, the controller 203 may control the semiconductor memory device 100 to read the data corresponding to the received read request based on the converted physical address.

In step S200, the controller 203 may control the read operation of the semiconductor memory device using the RHT stored in the RHT storage 250. Step S200 may include steps S210, S220, S230, S240, S250, and S260 shown in FIG. 8. That is, step S200 of FIG. 18B may be performed the same or substantially the same as that described with reference to FIGS. 8 to 9C.

As a result of repeatedly performing the read operation by step S200, when the error correction for the read data repeatedly fails, step S300 is performed. More specifically, when the error correction failure occurs using all read voltages VR1", VR1', and VR1 included in the RHT in an attempt to read the data, step S200 ends and step S300 is performed. When the error correction is successful with respect to the read data, the read operation may end and step S300 may not be performed. That is, step S300 of FIG. 18B may be performed the same or substantially the same as described with reference to FIGS. 12 to 13D.

As a result of repeatedly performing the read operation by the RRT in step S300, when the error correction for the read data repeatedly fails, step S301 is performed. More specifically, according to the control of the optimum read voltage search component 280, the semiconductor memory device 100 repeatedly performs the read operation based on the plurality of reference read voltages. The optimum read voltage corresponding to a valley of the threshold voltage distribution is determined based on the plurality of read results by the plurality of reference read voltages, and the read operation is performed based on the determined optimum read voltage. Step S301 may include steps S315, S325, S335, S345, and S355 shown in FIG. 16. That is, step S301 of FIG. 18B may be performed the same or substantially the same as described with reference to FIGS. 16 and 17.

FIGS. 19A, 19B, and 19C are diagrams illustrating the RHT according to embodiments of the present disclosure.

First, referring to FIG. 19A, an RHT including read voltages for each of the memory blocks BLK1 to BLKz is shown. In the embodiment of FIG. 19A, the depth of the RHT is three. Therefore, for each of the memory blocks BLK1 to BLKz, the read voltages used in the three recent read-passed read operations R1_t1, R1_t2, and R1_t3 are included in the RHT. More specifically, with respect to a first memory block BLK1, read voltages VR1_a1, VR1_b1, and VR1_c1 used in the three recent read-passed read operations R1_t1, R1_t2, and R1_t3 are included in the RHT. In addition, with respect to a second memory block BLK2, read voltages VR1_a2, VR1_b2, and VR1_c2 used in the three recent read-passed read operations R1_t1, R1_t2, and R1_t3 are included in the RHT. In such a manner, with respect to a z-th memory block BLKz, read voltages VR1_$az$, VR1_$bz$, and VR1_$cz$ used in the three recent read-passed read operations R1_t1, R1_t2, and R1_t3 are stored in the RHT. As described above, the depth of the RHT shown in FIG. 19A is 3. However, this is merely an example; the RHT may be a different depth considering the trade-off noted above.

Referring to FIG. 19B, an RHT including read voltages for pages P1 to Pn included in each of the memory blocks BLK1 to BLKz is shown. In the embodiment of FIG. 19B, the depth of the RHT is 3. Therefore, for each of the pages P1 to Pn of each of the memory blocks BLK1 to BLKz, the read voltages used in the three recent read-passed read operations R1_t1, R1_t2, and R1_t3 are stored in the RHT. More specifically, with respect to a first page P1 of the first memory block BLK1, read voltages VR1_a11, VR1_b11, VR1_c11 used in the three recent read-passed read operations R1_t1, R1_t2, and R1_t3 are included in the RHT. In addition, with respect to a second page P2 of the first memory block BLK1, read voltages VR1_a21, VR1_b21, VR1_c21 used in the three recent read-passed read operations R1_t1, R1_t2, and R1_t3 are included in the RHT. In such a manner, with respect to an n-th page Pn of the first memory block BLK1, read voltages VR1_an1, VR1_bn1, and VR1_cn1 used in the three recent read-passed read operations R1_t1, R1_t2, and R1_t3 are included in the RHT. With respect to each of the pages P1 to Pn included in the other memory blocks BLK2 to BLKz, read voltages used in the three recent read-passed read operations R1_t1, R1_t2, and R1_t3 may be included in the RHT. The depth of the RHT shown in FIG. 19B is 3, which is an example. As previously described, the RHT may be of any suitable depth.

When the read voltage for each of the plurality of pages P1 to Pn included in the memory block is included in the RHT, performance of the memory systems 1000, 1001, 1002, and 1003 is improved, however, the capacity of the RHT storage 250 is increased. Accordingly, the plurality of pages P1 to Pn included in the memory block may be grouped to include the read voltage for each group in the RHT.

Referring to FIG. 19C, an RHT including read voltages for page groups GR1 to GRk included in each of the memory blocks BLK1 to BLKz is shown. One page group may include a plurality of pages. In the embodiment of FIG. 19C, the depth of the RHT is 3. Therefore, for each of the page groups GR1 to GRk of each of the memory blocks BLK1 to BLKz, the read voltages used in the three recent read-passed read operations R1_t1, R1_t2, and R1_t3 are included in the RHT. More specifically, with respect to a first page group GR1 of the first memory block BLK1, read voltages VR1_a11, VR1_b11, and VR1_c11 used in the three recent read-passed read operations R1_t1, R1_t2, and R1_t3 are included in the RHT. In addition, with respect to a second page group GR2 of the first memory block BLK1, read voltages VR1_a21, VR1_b21, and VR1_c21 used in the three recent read-passed read operations R1_t1, R1_t2, and R1_t3 are included in the RHT. In such a manner, with respect to a k-th page group GRk of the first memory block BLK1, read voltages VR1_ak1, VR1_bk1, and VR1_ck1 used in the three recent read-passed read operations R1_t1, R1_t2, and R1_t3 are included in the RHT. With respect to each of the page groups GR1 to GRk included in the other memory blocks BLK2 to BLKz, read voltages used in the three recent read-passed read operations R1_t1, R1_t2, and R1_t3 may be included in the RHT. As described above, 3, which is the depth of the RHT shown in FIG. 19C, is an example the RHT may be any suitable depth.

Figure 20:
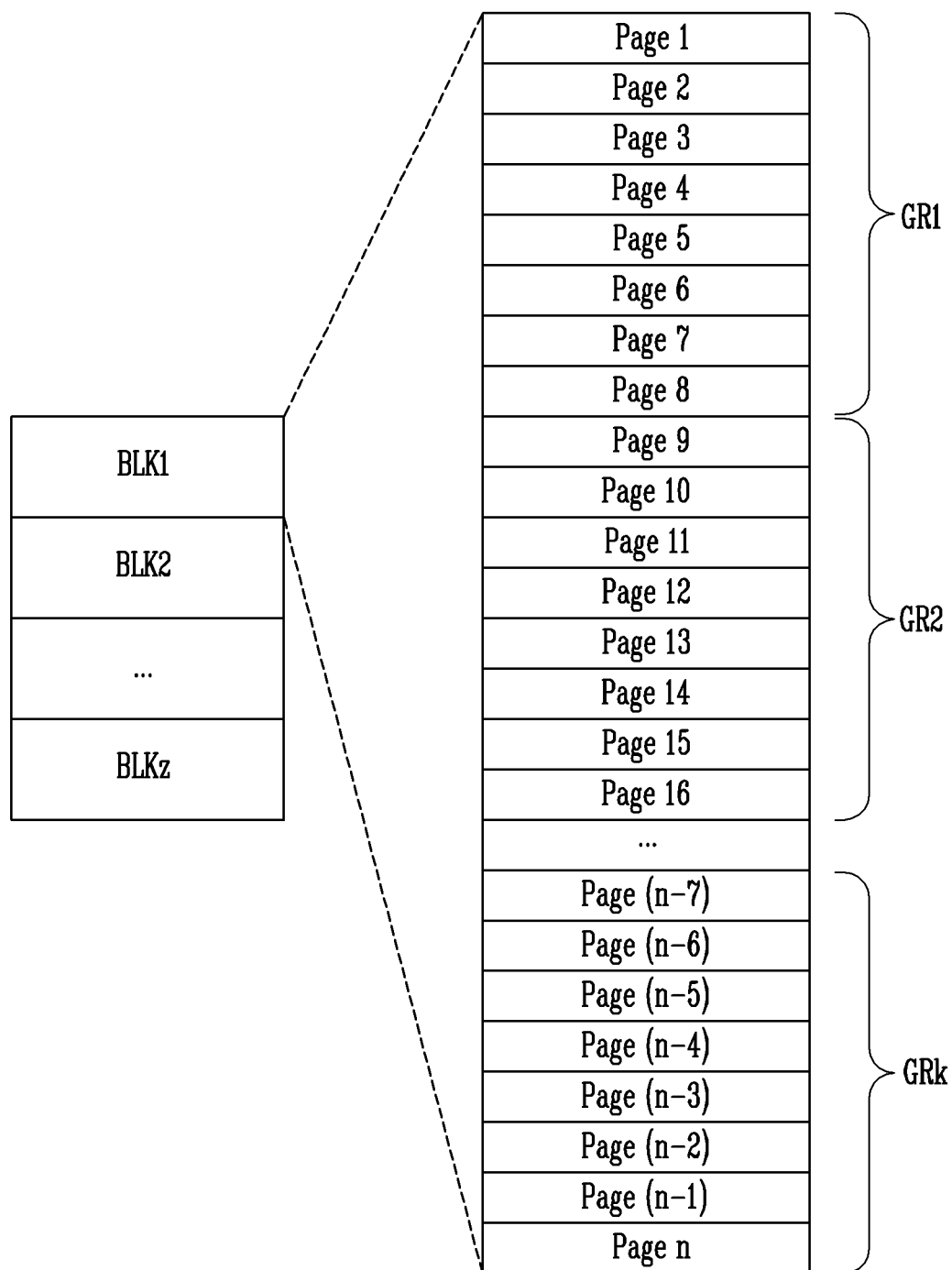
FIG. 20 is a diagram for describing the RHT shown in FIG. 19C.

FIG. 20 is a diagram for describing the RHT shown in FIG. 19C. Referring to FIG. 20, each of the plurality of memory blocks BLK1 to BLKz included in the memory cell array 110 of the semiconductor memory device 100 includes first to n-th pages Page 1 to Page n. The first to n-th pages Page 1 to Page n may be grouped into first to k-th page groups GR1 to GRk. In an example of FIG. 20, each of the first to k-th page groups GR1 to GRk includes 8 pages, but the present disclosure is not limited thereto. One page group may include any suitable number of pages.

Figures 21, 22:
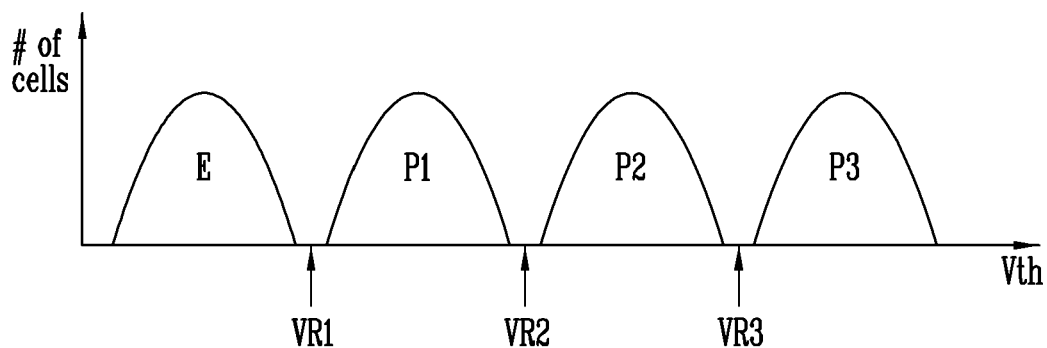
FIG. 21 is a diagram illustrating a threshold voltage distribution of a multi-level cell (MLC).
FIG. 22 is a diagram illustrating an example of the RHT for a memory block including the MLC.

FIG. 21 is a diagram illustrating a threshold voltage distribution of a multi-level cell (MLC). According to the MLC, two bits of data may be stored in one memory cell. In order to store two bits of data, the threshold voltage of the memory cell belongs to any one of an erase state E, a first program state P1, a second program state P2, and a third program state P3. A first read voltage VR1, a second read voltage VR2, and a third read voltage VR3 are used to distinguish the threshold voltage of the MLC. According to an embodiment of the present disclosure, the RHT may be used for each of the first to third read voltages VR1 to VR3 used in reading the MLC.

FIG. 22 is a diagram illustrating an example of the RHT for the memory block including MLCs.

Referring to FIG. 22, a RHT_MLC including first to third read voltages for each of the memory blocks BLK1 to BLKz is shown. In the embodiment of FIG. 22, the depth of the RHT is 2. Therefore, for each of the memory blocks BLK1 to BLKz, read voltages used in two recent read-passed read operations are included in the RHT. More specifically, for the read operation of the MLC, as shown in FIG. 21, sub read operations respectively using the first to third read voltages VR1 to VR3 may be performed. A first sub read operation is a sub read operation for distinguishing the erase state E and the first program state P1 from each other, a second sub read operation is a sub read operation for distinguishing the first program state P1 and the second program state P2 from each other, and the third sub read operation is a sub read operation for distinguishing the second program state P2 and the third program state P3 from each other.

In the RHT_MLC of FIG. 22, read voltages VR1_a1 and VR1_b1 used in two recent read-passed first sub read operations R1_t1 and R1_t2 with respect to the first memory block BLK1 are included in the RHT. In addition, read voltages VR2_a1 and VR2_b1 used in two recent read-passed second sub read operations R2_t1 and R2_t2 with respect to the first memory block BLK1 are included in the RHT. In addition, read voltages VR3_a1 and VR3_b1 used in two recent read-passed third sub read operations R3_t1 and R3_t2 with respect to the first memory block BLK1 are included in the RHT. The same applies to other memory blocks BLK2 to BLKz.

FIG. 22 shows the RHT_MLC for an MLC storing 2 bits of data per memory cell, but the present disclosure is not limited thereto. In particular, the RHT and the read operation using the RHT according to an embodiment of the present disclosure may be applied to a triple-level cell (TLC), a quad-level cell (QLC), or memory cells storing data of 5 bits or more.

Figure 23:
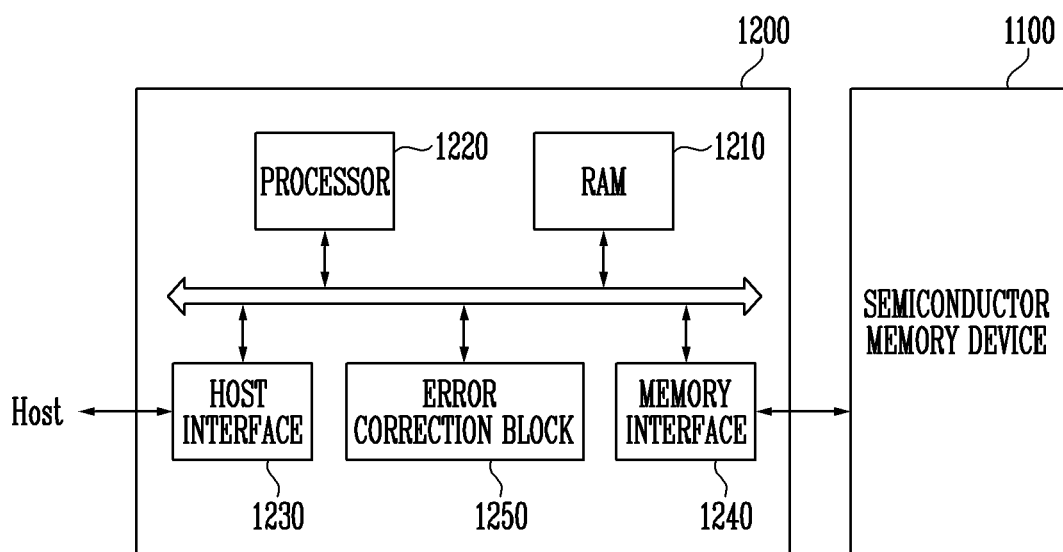
FIG. 23 is a block diagram illustrating a memory system including the controller of FIG. 1, 10, 14, or 18A.

FIG. 23 is a block diagram illustrating a memory system including the controller of FIG. 1, 10, 14, or 18A.

Referring to FIG. 23, the memory system 1000 includes the semiconductor memory device 1100 and the controller 1200. The semiconductor memory device 1100 may be the semiconductor memory device described with reference to FIG. 2.

The controller 1200 is connected to the host (Host) and the semiconductor memory device 1100. The controller 1200 is configured to access the semiconductor memory device 1100 in response to the request from the host. For example, the controller 1200 is configured to control read, write, erase, and background operations of the semiconductor memory device 1100. The controller 1200 is configured to provide an interface between the semiconductor memory device 1100 and the host. The controller 1200 is configured to drive firmware for controlling the semiconductor memory device 1100. The controller 1200 may be the controller 200, 201, 202, or 203 described with reference to FIG. 1, 10, 14, or 18A.

The controller 1200 includes a random access memory (RAM) 1210, a processor 1220, a host interface 1230, a memory interface 1240, and an error correction block 1250.

The RAM 1210 is used as any one of an operation memory of the processor 1220, a cache memory between the semiconductor memory device 1100 and the host, and a buffer memory between the semiconductor memory device 100 and the host. The processor 1220 controls overall operation of the controller 1200. In addition, the controller 1200 may temporarily store program data provided from the host during the write operation.

The host interface 1230 includes a protocol for performing data exchange between the host and the controller 1200. In an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer small interface (SCSI) protocol, an enhanced small disk interface (ESDI) protocol, an integrated drive electronics (IDE) protocol, and/or a private protocol.

The memory interface 1240 interfaces with the semiconductor memory device 1100. For example, the memory interface includes a NAND interface or a NOR interface.

The error correction block 1250 is configured to detect and correct an error of data received from the semiconductor memory device 1100 using an error correcting code (ECC). The processor 1220 may control the read voltage according to an error detection result of the error correction block 1250 and control the semiconductor memory device 1100 to perform re-reading. In an embodiment, the error correction block may be provided as a component of the controller 1200.

The controller 1200 and the semiconductor memory device 1100 may be integrated into one semiconductor device. In an embodiment, the controller 1200 and the semiconductor memory device 1100 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

The controller 1200 and the semiconductor memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

In an embodiment, the semiconductor memory device 1100 or the memory system 1000 may be mounted as a package of any of various types. For example, the semiconductor memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 24:
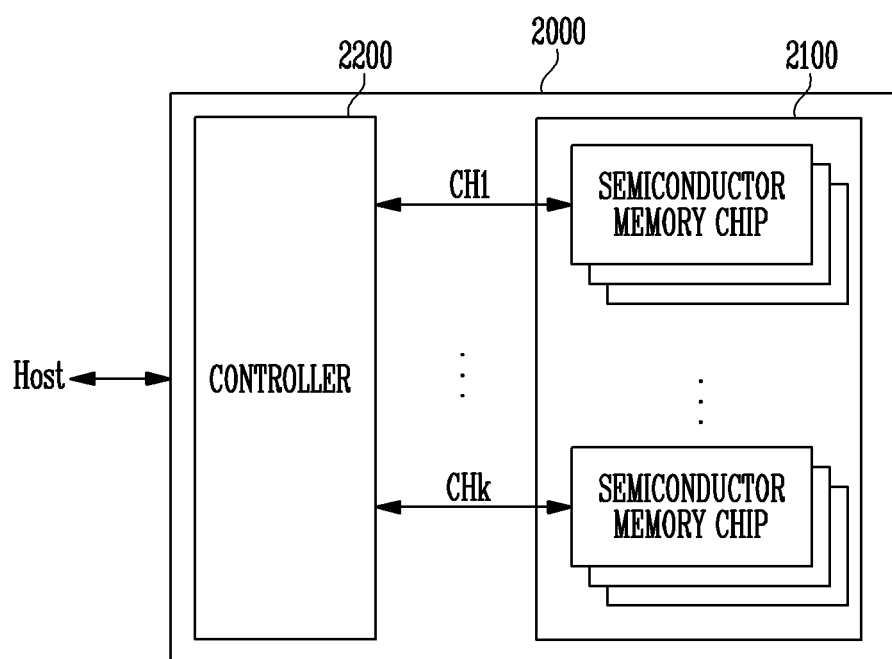
FIG. 24 is a block diagram illustrating an application example of the memory system of FIG. 23.

FIG. 24 is a block diagram illustrating an application example of the memory system of FIG. 23.

Referring to FIG. 24, the memory system 2000 includes a semiconductor memory device 2100 and a controller 2200. The semiconductor memory device 2100 includes a plurality of semiconductor memory chips. The plurality of semiconductor memory chips are divided into a plurality of, e.g., k, groups.

In FIG. 24, the k groups communicate with the controller 2200 through first to k-th channels CH1 to CHk, respectively. Each semiconductor memory chip is configured and is operated similarly to one of the semiconductor memory device 1100 described with reference to FIG. 2.

Each group is configured to communicate with the controller 2200 through one common channel. The controller 2200 is configured similarly to the controller 1200 described with reference to FIG. 17 and is configured to control the plurality of memory chips of the semiconductor memory device 2100 through the plurality of channels CH1 to CHk.

Figure 25:
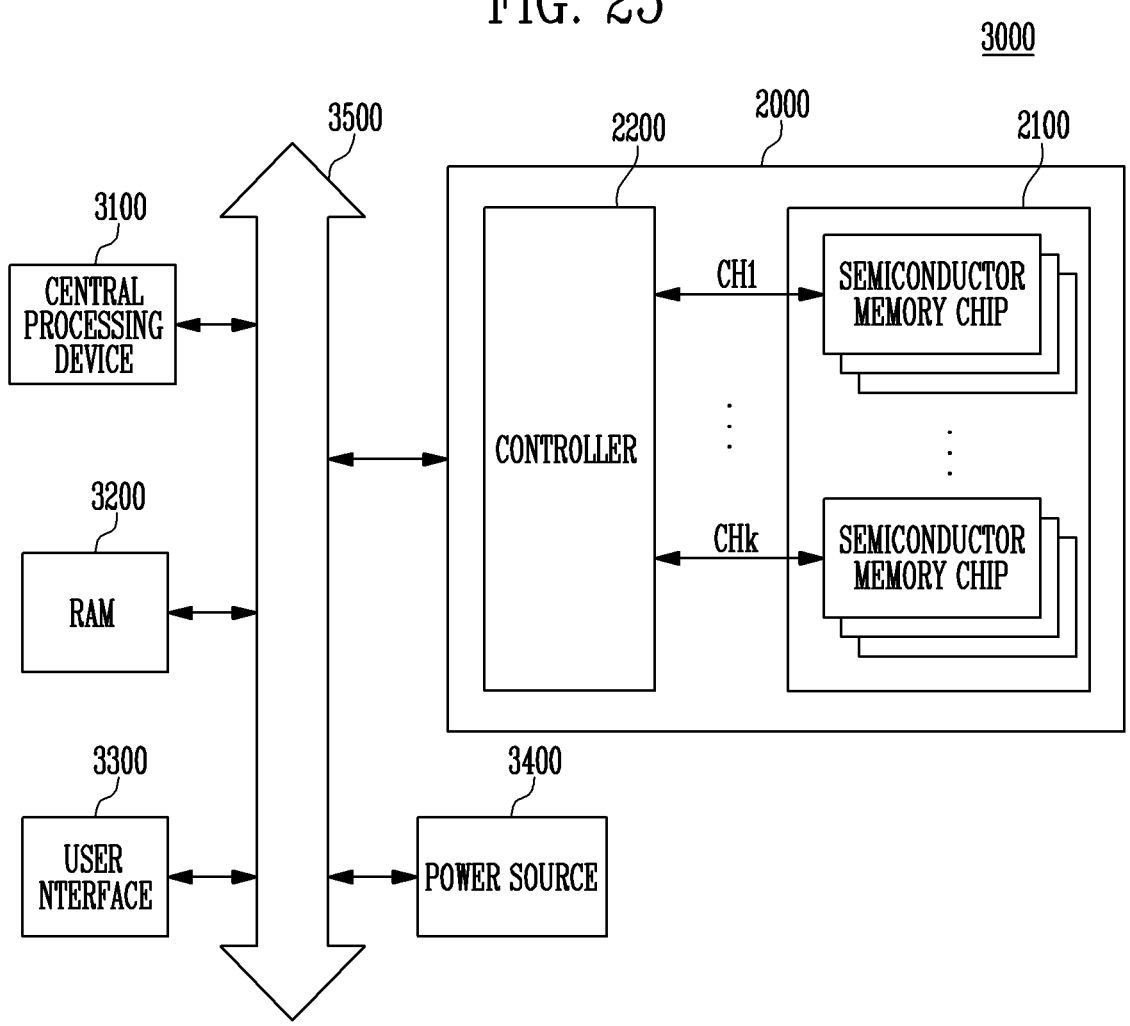
FIG. 25 is a block diagram illustrating a computing system including the memory system described with reference to FIG. 24.

FIG. 25 is a block diagram illustrating a computing system including the memory system described with reference to FIG. 24.

The computing system 3000 includes a central processing device 3100, a random access memory (RAM) 3200, a user interface 3300, a power source 3400, a system bus 3500, and the memory system 2000.

The memory system 2000 is electrically connected to the central processing device 3100, the RAM 3200, the user interface 3300, and the power source 3400 through the system bus 3500. Data provided through the user interface 3300 or processed by the central processing device 3100 is stored in the memory system 2000.

In FIG. 25, the semiconductor memory device 2100 is connected to the system bus 3500 through the controller 2200. However, the semiconductor memory device 2100 may be configured to be directly connected to the system bus 3500. A function of the controller 2200 is performed by the central processing device 3100 and the RAM 3200.

In FIG. 25, the memory system 2000 described with reference to FIG. 24 is provided. However, the memory system 2000 may be replaced with the memory system 1000 described with reference to FIG. 23. In an embodiment, the computing system 3000 may be configured to include both of the memory systems 1000 and 2000 described with reference to FIGS. 23 and 24.

The embodiments disclosed herein are merely specific examples presented to described the technical content of the present disclosure and facilitate understanding thereof. However, the disclosed embodiments are not intended to limit the scope of the present invention. It will be apparent to a person skilled in the art to which the present disclosure pertains that various modifications may be made to any of the disclosed embodiments within the spirit and scope of the invention.

What is claimed is:

1. A method of operating a controller that controls a semiconductor memory device including a plurality of memory blocks, the method comprising:
   receiving a read request for data included in a select memory block among the plurality of memory blocks from a host;
   controlling the semiconductor memory device to read data corresponding to the read request using a read-history table; and
   controlling the semiconductor memory device to perform a read operation using an additional read method, and updating the read-history table according to a result of the read operation using the additional read method, when error correction of read data using the read-history table failed,
   wherein the read-history table includes read voltages used in previously successful read pass operations on the select memory block.

2. The method of claim 1, wherein controlling the semiconductor memory device to perform the read operation using the additional read method and updating the read-history table comprises controlling the read operation of the semiconductor memory device using a read retry table.

3. The method of claim 2, wherein controlling the read operation of the semiconductor memory device using the read retry table comprises:
   controlling the read operation of the semiconductor memory device using a first read voltage selected from a plurality of read voltages in the read retry table; and
   controlling the read operation of the semiconductor memory device using a second read voltage selected from the plurality of read voltages in the read retry table when error correction of read data using the first read voltage failed.

4. The method of claim 2, wherein controlling the read operation of the semiconductor memory device using the read retry table comprises:
   controlling the read operation of the semiconductor memory device using a first read voltage selected from a plurality of read voltages in the read retry table; and
   updating the read-history table based on the first read voltage when error correction of read data using the first read voltage is successful.

5. The method of claim 1, wherein controlling the semiconductor memory device to perform the read operation using the additional read method and updating the read-history table comprises controlling the read operation of the semiconductor memory device using an optimum read voltage search method.

6. The method of claim 5, wherein controlling the read operation of the semiconductor memory device using the optimum read voltage search method comprises:
   controlling the semiconductor memory device to repeatedly perform read operations using a plurality of reference read voltages to generate a plurality of read results, respectively;
   determining an optimum read voltage based on the plurality of read results received from the semiconductor memory device; and
   controlling the semiconductor memory device to perform a read operation based on the optimum read voltage.

7. The method of claim 6, wherein controlling the read operation of the semiconductor memory device using the optimum read voltage search method comprises updating the read-history table based on the optimum read voltage when error correction of read data using the optimum read voltage is successful.

8. The method of claim 1, wherein controlling the semiconductor memory device to read the data corresponding to the read request using the read-history table comprises:
   generating a first read command corresponding to the read request and transferring the first read command to the semiconductor memory device;
   determining whether first error correction failure for read data corresponding to the first read command occurs; and
   determining, among a plurality of read voltages in the read-history table, a first read voltage used for a first read operation, which is a most recently successful read operation, as a read voltage to be used for a next read operation, when the first error correction failure occurs.

* * * * *